United States Patent
Yamamoto et al.

(10) Patent No.: US 12,094,994 B2
(45) Date of Patent: Sep. 17, 2024

(54) SOLAR CELL, MULTI-JUNCTION SOLAR CELL, SOLAR CELL MODULE, AND PHOTOVOLTAIC POWER GENERATION SYSTEM

(71) Applicants: KABUSHIKI KAISHA TOSHIBA, Tokyo (JP); TOSHIBA ENERGY SYSTEMS & SOLUTIONS CORPORATION, Kawasaki (JP)

(72) Inventors: Kazushige Yamamoto, Yokohama Kanagawa (JP); Naoyuki Nakagawa, Tokyo (JP); Yukitami Mizuno, Tokyo (JP); Soichiro Shibasaki, Tokyo (JP); Yuya Honishi, Saitama (JP); Mutsuki Yamazaki, Yokohama Kanagawa (JP); Yasutaka Nishida, Tokyo (JP)

(73) Assignees: KABUSHIKI KAISHA TOSHIBA, Tokyo (JP); TOSHIBA ENERGY SYSTEMS & SOLUTIONS CORPORATION, Kawasaki (JP)

( * ) Notice: Subject to any disclaimer, the term of this patent is extended or adjusted under 35 U.S.C. 154(b) by 135 days.

(21) Appl. No.: 17/898,513

(22) Filed: Aug. 30, 2022

(65) Prior Publication Data
US 2023/0086765 A1 Mar. 23, 2023

Related U.S. Application Data

(63) Continuation of application No. PCT/JP2021/033994, filed on Sep. 15, 2021.

(30) Foreign Application Priority Data

Oct. 9, 2020 (JP) .................................. 2020-171579

(51) Int. Cl.
H01L 31/072 (2012.01)
H01L 31/032 (2006.01)
H01L 31/0725 (2012.01)

(52) U.S. Cl.
CPC .......... *H01L 31/072* (2013.01); *H01L 31/032* (2013.01); *H01L 31/0725* (2013.01)

(58) Field of Classification Search
None
See application file for complete search history.

(56) References Cited

U.S. PATENT DOCUMENTS

2012/0285523 A1 11/2012 Negami et al.
2018/0190824 A1 7/2018 Bae et al.
(Continued)

FOREIGN PATENT DOCUMENTS

CN 109309136 2/2019
JP 2004-214300 7/2004
(Continued)

OTHER PUBLICATIONS

Naceur et al., Optical Materials, 115, (2021), 111060. (Year: 2021).*
(Continued)

*Primary Examiner* — Eli S Mekhlin
(74) *Attorney, Agent, or Firm* — Amin, Turocy & Watson, LLP

(57) ABSTRACT

A solar cell of an embodiment includes a p-electrode, an n-electrode, a p-type light-absorbing layer located between the p-electrode and the n-electrode and mainly containing a cuprous oxide, and an n-type layer that includes a first n-type layer which is located between the p-type light-absorbing layer and the n-electrode, which mainly contains a compound represented by $Ga_{v1}Zn_{v2}Sn_{v3}M1_{v4}O_{v5}$, the M1 being one or more selected from the group consisting of Hf, Zr, In, Ti, Al, B, Mg, Si, and Ge, the v1, the v2, and the v4 being (Continued)

numerical values of 0.00 or more, the v3 and the v5 being numerical values of more than 0, at least one of the v1 and the v2 being a numerical value of more than 0, and the v5 when a sum of the v1, the v2, the v3, and the v4 is 1 being 1.00 or more and 2.00 or less, and which is located on the n-electrode side, and a second n-type layer which is a layer that mainly contains a compound represented by $Ga_{w1}M2_{w2}M3_{w3}M4_{w4}O_{w5}$, the M2 being Al or/and B, the M3 is one or more selected from the group consisting of In, Ti, Zn, Hf, and Zr, the M4 being one or more selected from the group consisting of Sn, Si, and Ge, the w1 and the w5 being numerical values of more than 0, the w2, the w3, and the w4 being numerical values of 0.00 or more, and the w5 when a sum of the w1, the w2, the w3, and the w4 is 2 being 3.00 or more and 3.80 or less, and which is located on the p-type light-absorbing layer side.

20 Claims, 14 Drawing Sheets

(56) References Cited

U.S. PATENT DOCUMENTS

| | | | |
|---|---|---|---|
| 2020/0006589 | A1 | 1/2020 | Yamamoto et al. |
| 2023/0125003 | A1 | 4/2023 | Nakagawa et al. |

FOREIGN PATENT DOCUMENTS

| | | |
|---|---|---|
| JP | 2005-123272 | 5/2005 |
| JP | 2006-332373 | 12/2006 |
| JP | 2007-013098 | 1/2007 |
| JP | 2014-053572 | 3/2014 |
| JP | 2017-034186 | 2/2017 |
| JP | 2017-098479 | 6/2017 |
| JP | 2018-046196 | 3/2018 |
| WO | 2011/090134 | 7/2011 |
| WO | 2019/146120 | 8/2019 |
| WO | 2022/074852 | 4/2022 |

OTHER PUBLICATIONS

Shibasaki et al., 2019 IEEE 47th Photovoltaic Specialists Conference, held between Jun. 16, 2019 to Jun. 21, 2019 (Year: 2019).*
Minami et al., J. Semicond., 2016 37(1). (Year: 2016).*
International Search Report for International Application No. PCT/JP2021/033994 mailed on Dec. 13, 2021, 12 pgs.
Minami, et al., "Heterojunction solar cell with 6% efficiency based on an n-type aluminum-gallium-oxide thin film and p-type sodium-doped Cu2O sheet" Applied Physics Express 8, 022301 (2015).
Y. Ievskaya, et al., "Fabrication of ZnO/Cu2O heterojunctions in atmospheric conditions: Improved interface quality and solar cell performance", Solar Energy Materials & Solar Cells, vol. 135, 2015, pp. 43-48.
Peiwei LV, et al., "I-V Characteristics of ZnO/Cu2O thin film n-i-p. heterojunction", Physica B, Elsevier, vol. 406, 2011, pp. 1253-1257.

* cited by examiner

| | First n-type layer (Fourth region) | Second n-type layer (First region) | Third n-type layer (Second region) |
|---|---|---|---|
| Example 1 | $Zn_{0.80}Sn_{0.20}O_{1.20}$ | $Ga_{1.80}Al_{0.20}O_{3.00}$ | - |
| Example 2 | $Ga_{0.50}Sn_{0.50}O_{2.2}$ | $Ga_{1.60}Al_{0.40}O_{3.00}$ | - |
| Example 3 | $Zn_{0.80}Sn_{0.20}O_{1.20}$ | $Ga_2O_3$ | $Ga_{1.50}Al_{0.50}O_{3.00}$ |
| Example 4 | $Zn_{0.80}Sn_{0.20}O_{1.20}$ | $Ga_{1.80}Al_{0.20}O_{3.00}$ | $Ga_{1.60}Al_{0.40}O_{3.00}$ |
| Example 5 | $Zn_{0.80}Sn_{0.20}O_{1.20}$ | $Ga_2O_3$ | $Ga_{1.70}Al_{0.30}O_{3.00}$ |
| Example 6 | $Zn_{0.65}Sn_{0.35}O_{1.20}$ | $Ga_2O_3$ | $Ga_{1.80}Al_{0.20}O_{3.00}$ |
| Example 7 | $Zn_{0.80}Sn_{0.20}O_{1.20}$ | $Ga_2O_3$ | $Ga_{1.60}B_{0.40}O_{3.00}$ |
| Example 8 | $Zn_{0.80}Sn_{0.20}O_{1.20}$ | $Ga_{1.90}Sn_{0.10}O_{3.05}$ | $Ga_{1.60}Al_{0.40}O_{3.00}$ |
| Example 9 | $Zn_{0.80}Sn_{0.20}O_{1.20}$ | $Ga_{1.90}Si_{0.10}O_{3.05}$ | $Ga_{1.60}Al_{0.40}O_{3.00}$ |
| Example 10 | $Zn_{0.80}Sn_{0.20}O_{1.20}$ | $Ga_{1.90}Ge_{0.10}O_{3.05}$ | $Ga_{1.40}Al_{0.60}O_{3.00}$ |
| Example 11 | $Zn_{0.80}Sn_{0.20}O_{1.20}$ | $Ga_2O_3$ | $Ga_{1.65}Al_{0.20}Hf_{0.10}Sn_{0.05}O_{3.00}$ |
| Example 12 | $Zn_{0.80}Sn_{0.20}O_{1.20}$ | $Ga_2O_3$ | $Ga_{1.65}Al_{0.20}Zr_{0.10}Sn_{0.05}O_{3.00}$ |
| Example 13 | $Zn_{0.80}Sn_{0.20}O_{1.20}$ | $Ga_2O_3$ | $Ga_{1.30}Al_{0.60}In_{0.05}Sn_{0.05}O_{3.05}$ |
| Example 14 | $Zn_{0.80}Sn_{0.20}O_{1.20}$ | $Ga_2O_3$ | $Ga_{1.30}Al_{0.60}Ti_{0.05}Sn_{0.05}O_{3.05}$ |
| Example 15 | $Zn_{0.60}Sn_{0.35}Al_{0.05}O_{1.23}$ | $Ga_{1.80}Al_{0.20}O_{3.00}$ | $Ga_{1.40}Al_{0.60}O_{3.00}$ |
| Example 16 | $Zn_{0.65}Sn_{0.35}O_{1.20}$ | $Ga_2O_3$ | $Ga_{1.80}Al_{0.20}O_{3.00}$ |
| Example 17 | $Zn_{0.65}Sn_{0.15}O_{1.20}$ | $Ga_2O_3$ | $Ga_{1.80}Al_{0.20}O_{3.00}$ |
| Example 18 | $Zn_{0.78}Sn_{0.22}O_{1.22}$ | $Ga_2O_3$ | $Ga_{1.40}Al_{0.60}O_{3.00}$ |
| Example 19 | $Zn_{0.79}Sn_{0.21}O_{1.21}$ | $Ga_2O_3$ | $Ga_{1.40}Al_{0.60}O_{3.00}$ |
| Example 20 | $Zn_{0.77}Sn_{0.23}O_{1.23}$ | $Ga_2O_3$ | $Ga_{1.40}Al_{0.60}O_{3.00}$ |
| Example 21 | $Zn_{0.81}Sn_{0.19}O_{1.19}$ | $Ga_2O_3$ | $Ga_{1.40}Al_{0.60}O_{3.00}$ |
| Example 22 | $Zn_{0.80}Sn_{0.20}O_{1.20}$ | $Ga_2O_3$ | $Ga_{1.40}Al_{0.60}O_{3.00}$ |
| Example 23 | $Zn_{0.78}Sn_{0.22}O_{1.22}$ | $Ga_2O_3$ | $Ga_{1.40}Al_{0.60}O_{3.00}$ |
| Example 24 | $Zn_{0.70}Sn_{0.30}O_{1.30}$ | $Ga_2O_3$ | $Ga_{1.40}Al_{0.60}O_{3.00}$ |
| Example 25 | $Zn_{0.70}Sn_{0.30}O_{1.30}$ | $Ga_2O_3$ | $Ga_{1.40}Al_{0.60}O_{3.00}$ |
| Example 26 | $Zn_{0.50}Sn_{0.50}O_{1.50}$ | $Ga_2O_3$ | $Ga_{1.40}Al_{0.60}O_{3.00}$ |
| Example 27 | $Zn_{0.50}Sn_{0.50}O_{1.50}$ | $Ga_2O_3$ | $Ga_{1.40}Al_{0.60}O_{3.00}$ |
| Comparative Example 1 | - | $Ga_2O_3$ | - |
| Comparative Example 2 | - | $Ga_{1.40}Al_{0.60}O_{3.00}$ | - |
| Comparative Example 3 | - | $Ga_2O_3$ | $Ga_{1.80}Al_{0.20}O_{3.00}$ |
| Comparative Example 4 | ZnO | $Ga_{1.40}Al_{0.60}O_{3.00}$ | - |

Fig.15A

| | Fourth n-type layer (Third region) | Fifth n-type layer (Fifth region) | n-electrode |
|---|---|---|---|
| Example 1 | - | - | AZO Zn:Al=96.9:3.1 |
| Example 2 | - | - | AZO Zn:Al=97.0:3.0 |
| Example 3 | - | - | AZO Zn:Al=97.8:2.2 |
| Example 4 | - | - | AZO Zn:Al=96.8:3.2 |
| Example 5 | $Ga_{1.40}Al_{0.60}O_{3.00}$ | - | AZO Zn:Al=96.9:3.1 |
| Example 6 | $Ga_{1.40}Al_{0.60}O_{3.00}$ | $Zn_{0.80}Sn_{0.20}O_{1.20}$ | AZO Zn:Al=96.6:3.4 |
| Example 7 | - | - | AZO Zn:Al=96.8:3.2 |
| Example 8 | - | - | AZO Zn:Al=96.0:4.0 |
| Example 9 | - | - | AZO Zn:Al=96.8:3.2 |
| Example 10 | - | - | AZO Zn:Al=96.5:3.5 |
| Example 11 | - | - | AZO Zn:Al=97.5:2.5 |
| Example 12 | - | - | AZO Zn:Al=96.9:3.1 |
| Example 13 | - | - | AZO Zn:Al=95.6:4.4 |
| Example 14 | - | - | AZO Zn:Al=96.3:3.7 |
| Example 15 | - | $Zn_{0.80}Sn_{0.20}O_{1.20}$ | AZO Zn:Al=96.9:3.1 |
| Example 16 | $Ga_{1.40}Al_{0.60}O_{3.00}$ | $Zn_{0.80}Sn_{0.20}O_{1.20}$ | AZO Zn:Al=95.7:4.3 |
| Example 17 | $Ga_{1.40}Al_{0.60}O_{3.00}$ | $Zn_{0.80}Sn_{0.20}O_{1.20}$ | AZO Zn:Al=96.8:3.2 |
| Example 18 | - | - | BZO Zn:B=97:3 |
| Example 19 | - | - | BZO Zn:B=97:3 |
| Example 20 | - | - | BZO Zn:B=97:3 |
| Example 21 | - | - | GZO Zn:Ga=97:3 |
| Example 22 | - | - | GZO Zn:Ga=97:3 |
| Example 23 | - | - | GZO Zn:Ga=97:3 |
| Example 24 | - | - | ITO In:Sn=95:5 |
| Example 25 | - | - | ITO In:Sn=95:5 |
| Example 26 | - | - | ITO In:Sn=90:10 |
| Example 27 | - | - | ITO In:Sn=90:10 |
| Comparative Example 1 | - | - | AZO Zn:Al=96.9:3.1 |
| Comparative Example 2 | - | - | AZO Zn:Al=96.9:3.1 |
| Comparative Example 3 | $Ga_{1.40}Al_{0.60}O_{3.00}$ | - | AZO Zn:Al=96.9:3.1 |
| Comparative Example 4 | - | - | AZO Zn:Al=96.9:3.1 |

Fig.15B

|  | Transmittance | Jsc | Voc | FF | Conversion efficiency |
|---|---|---|---|---|---|
| Example 1 | A | B | B | B | B |
| Example 2 | A | B | B | B | B |
| Example 3 | A | A | A | A | A |
| Example 4 | A | B | A | B | A |
| Example 5 | A | B | A | A | A |
| Example 6 | A | A | A | A | A |
| Example 7 | A | A | A | A | A |
| Example 8 | A | B | A | A | B |
| Example 9 | A | A | A | B | A |
| Example 10 | A | A | A | A | A |
| Example 11 | A | B | A | A | B |
| Example 12 | A | B | A | A | A |
| Example 13 | A | A | A | B | A |
| Example 14 | A | A | A | A | A |
| Example 15 | A | A | A | A | A |
| Example 16 | A | A | A | A | A |
| Example 17 | A | A | A | A | A |
| Example 18 | A | A | A | A | A |
| Example 19 | A | A | A | A | A |
| Example 20 | A | A | A | B | A |
| Example 21 | A | A | A | A | A |
| Example 22 | A | B | A | A | A |
| Example 23 | A | A | A | B | A |
| Example 24 | A | B | A | A | A |
| Example 25 | A | B | A | A | B |
| Example 26 | A | A | A | A | A |
| Example 27 | A | B | A | A | A |
| Comparative Example 1 | B | - | - | - | - |
| Comparative Example 2 | B | C | C | C | C |
| Comparative Example 3 | A | B | C | C | C |
| Comparative Example 4 | A | C | C | C | C |

Fig.16

SOLAR CELL, MULTI-JUNCTION SOLAR CELL, SOLAR CELL MODULE, AND PHOTOVOLTAIC POWER GENERATION SYSTEM

CROSS-REFERENCE TO RELATED APPLICATIONS

This application is a Continuation application of International Patent Application No. PCT/JP2021/33994, the International Filing Date of which is Sep. 15, 2021, which is based upon and claims the benefit of priority from Japanese Application 2020-171579, the filing Date of which is Oct. 9, 2020, and the entire contents of both of which are incorporated herein by reference.

FIELD

Embodiments described herein relate generally to a solar cell, a multi-junction solar cell, a solar cell module, and a photovoltaic power generation system.

BACKGROUND

One of new solar cells is a solar cell using a cuprous oxide ($Cu_2O$) for a light-absorbing layer. $Cu_2O$ is a wide-gap semiconductor. Since $Cu_2O$ is a safe and inexpensive material including copper and oxygen abundantly present on the earth, it is expected that a high-efficiency and low-cost solar cell can be realized.

BRIEF DESCRIPTION OF THE DRAWINGS

FIG. 15A and FIG. 15B are tables related to n-type layers and n-electrodes of Examples; and FIG. 16 is a table related to Examples.

DETAILED DESCRIPTION

A solar cell of an embodiment includes a p-electrode, an n-electrode, a p-type light-absorbing layer located between the p-electrode and the n-electrode and mainly containing a cuprous oxide, and an n-type layer that includes a first n-type layer which is located between the p-type light-absorbing layer and the n-electrode, which mainly contains a compound represented by $Ga_{v1}Zn_{v2}Sn_{v3}M1_{v4}O_{v5}$, the M1 being one or more selected from the group consisting of Hf, Zr, In, Ti, Al, B, Mg, Si, and Ge, the v1, the v2, and the v4 being numerical values of 0.00 or more, the v3 and the v5 being numerical values of more than 0, at least one of the v1 and the v2 being a numerical value of more than 0, and the v5 when a sum of the v1, the v2, the v3, and the v4 is 1 being 1.00 or more and 2.00 or less, and which is located on the n-electrode side, and a second n-type layer which is a layer that mainly contains a compound represented by $Ga_{w1}M2_{w2}M3_{w3}M4_{w4}O_{w5}$, the M2 being Al or/and B, the M3 is one or more selected from the group consisting of In, Ti, Zn, Hf, and Zr, the M4 being one or more selected from the group consisting of Sn, Si, and Ge, the w1 and the w5 being numerical values of more than 0, the w2, the w3, and the w4 being numerical values of 0.00 or more, and the w5 when a sum of the w1, the w2, the w3, and the w4 is 2 being 3.00 or more and 3.80 or less, and which is located on the p-type light-absorbing layer side.

Hereinafter, an embodiment will be described in detail with reference to the drawings. Unless otherwise specified, values at 25° C. and 1 atm (atmosphere) are illustrated.

First Embodiment

Figure 1:
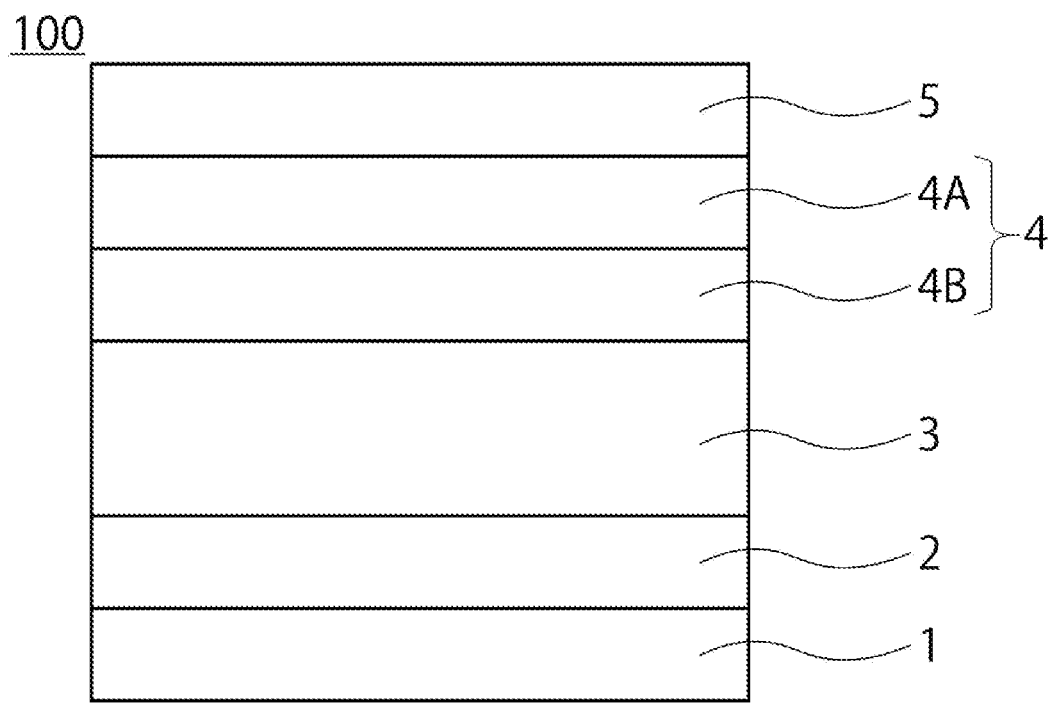
FIG. 1 is a cross-sectional view of a solar cell according to an embodiment.

A first embodiment relates to a solar cell. FIG. 1 illustrates a cross-sectional view of a solar cell 100 of the first embodiment. As illustrated in FIG. 1, the solar cell 100 according to the present embodiment includes a substrate 1, a p-electrode 2 as a first electrode, a p-type light-absorbing layer 3, an n-type layer 4, and an n-electrode 5 as a second electrode. In the first embodiment, the n-type layer 4 includes a first n-type layer 4A and a second n-type layer 4B. An intermediate layer (not illustrated) may be included between the n-type layer 4 and the n-electrode 5. Sunlight may be incident from either the n-electrode 5 side or the p-electrode 2 side, but is more preferably incident from the n-electrode 5 side. Since the solar cell 100 of the embodiment is a transmissive solar cell, it is preferable that the solar cell is used as a top cell (light incident side) of a multi-junction solar cell. In FIG. 1, the substrate 1 is provided on a side of the p-electrode 2 opposite to the p-type light-absorbing layer 3 side, but the substrate 1 may be provided on a side of the n-electrode 5 opposite to the n-type layer 4 side. Hereinafter, although a mode illustrated in FIG. 1 will be described, a mode in which the substrate 1 is provided on the n-electrode 5 side except that a position of the substrate 1 is different is also used. In the solar cell 100 of the embodiment, light is incident from the n-electrode 5 side toward the p-electrode 2 side.

The substrate 1 is a transparent substrate. A transparent organic substrates such as acrylic, polyimide, polycarbonate, polyethylene terephthalate (PET), polypropylene (PP), fluorine-based resins (polytetrafluoroethylene (PTFE), perfluoroethylene propene copolymer (FEP), ethylene tetrafluoroethylene copolymer (ETFE), polychlorotrifluoroethylene (PCTFE), perfluoroalkoxy alkane (PFA), and the like), polyarylate, polysulfone, polyethersulfone, and polyetherimide and inorganic substrates such as soda lime glass, white glass, chemically strengthened glass, and quartz can be used as the substrate 1. As the substrate 1, the substrates listed above can be laminated.

The p-electrode 2 is provided on the substrate 1 and is disposed between the substrate 1 and the p-type light-absorbing layer 3. The p-electrode 2 is a conductive layer having transparency provided on the p-type light-absorbing layer 3 side. A thickness of the p-electrode 2 is typically 100 nm or more and 2,000 nm or less. In FIG. 1, the p-electrode 2 is in direct contact with the light-absorbing layer 3. It is preferable that the p-electrode 2 includes one or more layers of transparent conductive oxide films (semiconductor conductive films). The transparent conductive oxide film is not particularly limited, and is an indium tin oxide (ITO), an Al-doped zinc oxide (AZO), a boron-doped zinc oxide (BZO), a gallium-doped zinc Oxide (GZO), a doped tin oxide, a titanium-doped indium oxide (ITiO), an indium zinc oxide (IZO), an indium gallium zinc oxide (IGZO), a hydrogen-doped indium oxide (IOH), or the like. The transparent conductive oxide film may be a stacked film having a plurality of films. A dopant for a film of tin oxide or the like is not particularly limited as long as the dopant is one or more selected from the group consisting of In, Si, Ge, Ti, Cu, Sb, Nb, Ta, W, Mo, F, Cl, and the like. It is preferable that the p-electrode 2 preferably includes a tin oxide film doped with one or more elements selected from the group consisting of In, Si, Ge, Ti, Cu, Sb, Nb, Ta, W, Mo, F, Cl, and the like. In the doped tin oxide film, one or more elements selected from the group consisting of In, Si, Ge, Ti, Cu, Sb, Nb, Ta, W, Mo, F, Cl, and the like are preferably contained at 10 atom % or less with respect to tin contained in the tin oxide film. As the p-electrode 2, a stacked film in which a transparent conductive oxide film and a metal film are stacked can be used. The metal film preferably has a thickness of 0 nm or less. Metal (including alloy) contained in the metal film is not particularly limited, and is Mo, Au, Cu, Ag, Al, Ta, W, or the like. It is preferable that the p-electrode 2 includes a dot-shaped, line-shaped, or mesh-shaped electrode (one or more selected from the group consisting of metal, an alloy, graphene, a conductive nitride, and a conductive oxide) between the transparent conductive oxide film and the substrate 1 or between the transparent conductive oxide film and the p-type light-absorbing layer 3. It is preferable that the dot-shaped, line-shaped, or mesh-shaped metal has an aperture ratio of 50% or more with respect to the transparent conductive film. The dot-like, line-like, or mesh-like metal is not particularly limited, and is Mo, Au, Cu, Ag, Al, Ta, W, or the like. When the metal film is used for the p-electrode 2, it is preferable that a film thickness is about 5 nm or less from the viewpoint of transparency. When the line-shaped or mesh-shaped metal film is used, since the transparency is secured at an opening, the film thickness of the metal film is not limited thereto.

It is preferable that the p-electrode 2 have a stacked structure in which an indium tin oxide film and a doped tin oxide film are stacked on each other. Specifically, it is preferable that the p-electrode 2 have one or more stacked structures selected from the group including a stacked film of an indium tin oxide film and an antimony-doped tin oxide film, a stacked film of an indium tin oxide film and a fluorine-doped tin oxide film, a stacked film of an indium tin oxide film and a Ta-doped tin oxide film, and a stacked film of an indium tin oxide film and a Nb-doped tin oxide film. When the p-electrode 3 includes a doped tin oxide film, it is preferable that the doped tin oxide film be in direct contact with the light-absorbing layer 3.

The p-type light-absorbing layer 3 is a p-type semiconductor layer. The p-type light-absorbing layer 3 may be in direct contact with the p-electrode 2, or other layers may be present as long as the contact with the p-electrode 2 can be secured. The p-type light-absorbing layer 3 is disposed between the p-electrode 2 and the first n-type layer 4A. The p-type light-absorbing layer 3 forms a p-n junction with the first n-type layer 4A. The p-type light-absorbing layer 3 is a semiconductor layer of a metal oxide containing Cu as a main component. The metal oxide containing Cu as the main component is a cuprous oxide or/and a complex oxide of cuprous oxides. 90 wt % or more of the p-type light-absorbing layer 3 is preferably a cuprous oxide or/and the complex oxide of cuprous oxides. 95 wt % or more of the p-type light-absorbing layer 3 is more preferably a cuprous oxide or/and a complex oxide of cuprous oxides. 98 wt % or more of the p-type light-absorbing layer 3 is still more preferably a cuprous oxide or/and a complex oxide of cuprous oxides. It is preferable that the p-type light-absorbing layer 3 hardly contains Cu or/and CuO which is a heterogeneous phase. Since the transmittance of the p-type light-absorbing layer 3 is increased, it is preferable that the p-type light-absorbing layer 3 contains less heterogeneous phases and has good crystallinity. In the metal oxide containing Cu as the main component, Cu is 60.0 atom % or more and 67.0 atom % or less, and oxygen (O) is 32.5 atom % or more and 34.0 atom % or less. The complex oxide of cuprous oxides contains metal other than Cu. The metal contained in the complex oxide of cuprous oxides is one or more metals selected from the group consisting of Sn, Sb, Ag, Li, Na, K, Cs, Rb, Al, Ga, In, Zn, Mg, and Ca in addition to Cu. When one or more metals selected from the group consisting of Ag, Li, Na, K, Cs, Rb, Al, Ga, In, Zn, Mg, and Ca are contained in addition to Cu, a band gap of the p-type light-absorbing layer 3 can be adjusted. The band gap of the p-type light-absorbing layer 3 is preferably 2.0 eV or more and 2.2 eV or less. When the band gap is in such a range, sunlight can be efficiently used in both a top cell and a bottom cell in the multi-junction solar cell in which the solar cell using Si for the light-absorbing layer is used as the bottom cell and the solar cell of the embodiment is used as the top cell. The p-type light-absorbing layer 3 may further contain Sn or Sb. Sn or Sb in the p-type light-absorbing layer 3 may be added to the light-absorbing layer 3 or may be derived from the p-electrode 2. The p-type light-absorbing layer 3 is a layer of an oxide represented by $Cu_aM_bO_c$. M is one or more metals selected from the group consisting of Sn, Sb, Ag, Li, Na, K, Cs, Rb, Al, Ga, In, Zn, Mg, and Ca. a, b, and c preferably satisfy $1.80 \leq a \leq 2.01$ (a is 1.80 or more and 2.01 or less), $0.00 \leq b \leq 0.20$ (b is 0.00 or more and 0.20 or less), and $0.98 \leq c \leq 1.02$ (c is 0.98 or more and 1.02 or less). A composition ratio of the p-type light-absorbing layer 3 is a composition ratio of the entire p-type light-absorbing layer 3. It is preferable that a compound composition ratio of the p-type light-absorbing layer 3 is entirely satisfied in the p-type light-absorbing layer 3. When concentrations of Sn and Sb in the p-type light-absorbing layer 3 are high, defects increase, and carrier recombination increases. Thus, a total volume concentration of Sb and Sn in the p-type light-absorbing layer 3 is preferably $1.5 \times 10^{19}$ atoms/cm$^3$ or less. Compositions of the p-type light-absorbing layer 3 and the first n-type layer 4A are obtained by secondary ion mass spectrometry (SIMS). As an analysis position, an average value of values obtained in the same manner as the p-electrode 2 can be used as each layer composition.

A thickness of the p-type light-absorbing layer 3 is obtained by cross-sectional observation with an electron microscope or a step profiler, and is preferably 1,000 nm or more and 10,000 nm or less.

The p-type light-absorbing layer 3 is preferably formed by, for example, sputtering.

The p-type light-absorbing layer 3 may contain an element such as Ga diffused from the n-type layer 4. Ga is not contained in a raw material for forming the p-type light-absorbing layer 3, and Ga contained in the n-type layer 4 is diffused into the p-type light-absorbing layer 3. When other elements are also used at the time of forming the n-type layer 4, these elements may also be diffused into the p-type light-absorbing layer 3.

The n-type layer 4 includes the first n-type layer 4A and the second n-type layer 4B. The first n-type layer 4A is located on the n-electrode 5 side. The second n-type layer 4B is located on the p-type light-absorbing layer 3 side.

It is preferable that the first n-type layer 4A is a layer that mainly contains (50 wt % or more of) a compound represented by $Ga_{v1}Zn_{v2}Sn_{v3}M1_{v4}O_{v5}$ and M1 is one or more selected from the group consisting of Hf, Zr, In, Ti, Al, B, Mg, Si, and Ge. v1, v2, and v4 are numerical values of 0.00 or more. v3 and v5 are numerical values of more than 0. At least one of v1 and v2 is a numerical value of more than 0. When the sum of v1, v2, v3, and v4 is 1, v5 is preferably 1.00 or more and 2.00 or less. All of a mode in which an oxide having Ga or/and Zn as a base is mixed with another oxide, a mode in which an oxide having Ga or/and Zn as a base is doped with another element, and a mode in which an oxide having Ga or/and Zn doped with another element as a base is mixed with another oxide are represented by $Ga_{v1}Zn_{v2}Sn_{v3}M1_{v4}O_{v5}$.

90 wt % or more of the first n-type layer 4A is preferably a compound represented by $Ga_{v1}Zn_{v2}Sn_{v3}M1_{v4}O_{v5}$. 95 wt % or more of the first n-type layer 4A is more preferably a compound represented by $Ga_{v1}Zn_{v2}Sn_{v3}M1_{v4}O_{v5}$. 98 wt % or more of the first n-type layer 4A is still more preferably a compound represented by $Ga_{v1}Zn_{v2}Sn_{v3}M1_{v4}O_{v5}$. The first n-type layer 4A more preferably contains a compound represented by $Ga_{v1}Zn_{v2}Sn_{v3}M1_{v4}O_{v5}$ (100 wt % of $Ga_{v1}Zn_{v2}Sn_{v3}M1_{v4}O_{v5}$).

Figure 2:
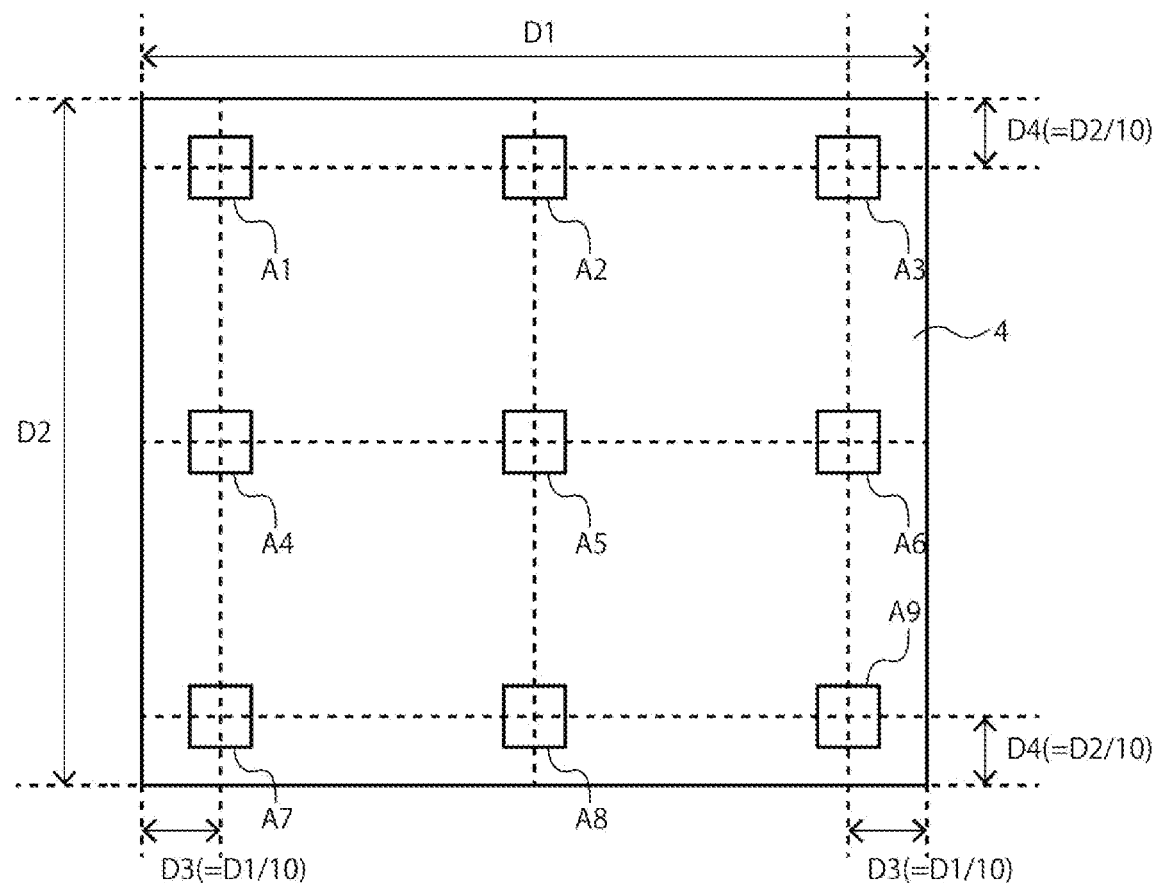
FIG. 2 is a diagram illustrating analysis spots of a solar cell according to an embodiment.

A composition of the compound of the first n-type layer 4A is an average composition of the entire first n-type layer 4A unless otherwise specified. When a thickness of the first n-type layer 4A is d, the composition of the first n-type layer 4A is an average value of the compositions at depths of 0.2 d, 0.5 d, and 0.8 d from a surface of the first n-type layer 4A on the n-electrode 5 side. Unless there is a condition that an elemental composition ratio of the compound of the first n-type layer 4A is inclined, the first n-type layer 4A preferably satisfies the above compositions and the following suitable compositions at the depths. When the first n-type layer 4A is very thin (for example, 5 nm or less), the composition at a depth of 0.5 d from the surface of the first n-type layer 4A on the n-electrode 5 side can be regarded as the composition of the entire first n-type layer 4A. In the analysis, analysis spots distributed as evenly as possible at equal intervals as represented in analysis spots of FIG. 2 at each distance from the surface of the n-type layer 4 are analyzed by, for example, secondary ion mass spectrometry (SIMS). FIG. 2 is a schematic diagram of the solar cell 100 as viewed from the light incident side. D1 is a length of the first n-type layer 4A in a width direction, and D2 is a length of the first n-type layer 4A in a depth direction.

The first n-type layer 4A is adjusted mainly by Ga, Zn, and Sn so as to reduce a difference in conduction band minimum from the second n-type layer 4B. The continuity of the connection of the conduction band minimum between the p-type light-absorbing layer 3 having high quality and the n-type layer in contact with the p-type light-absorbing layer 3 is also important. The connection between the n-electrode 5 and the first n-type layer 4A located on the n-electrode 5 side and preferably in direct contact with the n-electrode 5 greatly contributes to the improvement of conversion efficiency. For example, when $Ga_2O_3$ is directly connected to the n-electrode 5, since a difference between a work function of the n-electrode 5 and a conduction band minimum of $Ga_2O_3$ is large, it is difficult to improve conversion efficiency even though the continuity of the connection between the conduction band minimum of the p-type light-absorbing layer 3 and the conduction band minimum of the n-type layer 4 is good. A difference in the work function between the conduction band minimum of the first n-type layer 4A and the n-electrode 5 is reduced by using an oxide having ZnO or $Ga_2O_3$ as a base and containing a relatively large amount of Sn. A barrier for electron transfer between the first n-type layer 4A and the n-electrode 5 is reduced, and conversion efficiency is improved.

The first n-type layer 4A in which the difference in the work function between the conduction band minimum of the first n-type layer 4A and the n-electrode 5 is small is preferable. In order to reduce the difference in work function between the conduction band minimum of the first n-type layer 4A and the n-electrode 5, Ga, Zn, and Sn are contained in the compound of the first n-type layer 4A. The difference in the work function between the conduction band minimum of the first n-type layer 4A and the n-electrode 5 ([conduction band minimum of first n-type layer 4A]−[work function of n-electrode 5]) is preferably 0.1 eV or more and 0.3 eV or less, and more preferably 0.2 eV or more and 0.3 eV or less.

In the first n-type layer 4A, (v1+v2)/(v1+v2+v3+v4) is preferably 0.30 or more and 0.90 or less. From the same viewpoint, in the first n-type layer 4A, (v1+v2)/(v1+v2+v3+v4) is preferably 0.40 or more and 0.90 or less.

The first n-type layer 4A is located closest to the n-electrode 5 side in the n-type layer 4, and preferably, the first n-type layer 4A is in direct contact with the n-electrode 5. When Zn or Sn is contained in the second n-type layer 4B or the like in the n-type layer 4, the composition ratio thereof is preferably lower than the concentrations of Zn and Sn in the first n-type layer 4A.

The first n-type layer 4A preferably contains Sn. When Sn is contained in the first n-type layer 4A, the continuity of the connection at the conduction band minimum is preferably improved, and a carrier concentration is preferably increased. Thus, v3/(v1+v2+v3+v4) is preferably 0.10 or more and 0.70 or less, and more preferably 0.15 or more and 0.60 or less.

When the first n-type layer 4A contains Zn, v1/(v1+v2+v3+v4) is 0.00 or more and 0.10 or less, and v2/(v1+v2+v3+v4) is preferably 0.70 or more and 0.90 or less, more preferably 0.75 or more and 0.85 or less. When the above range is satisfied, v3/(v1+v2+v3+v4) is preferably 0.10 or more and 0.30 or less, and more preferably 0.15 or more and 0.25 or less.

When the first n-type layer 4A contains Ga, v2/(v1+v2+v3+v4) is 0.10 or less, and v1/(v1+v2+v3+v4) is preferably 0.30 or more and 0.80 or less, and more preferably 0.40 or more and 0.70 or less. When the above range is satisfied, v3/(v1+v2+v3+v4) is preferably 0.20 or more and 0.70 or less, and more preferably 0.20 or more and 0.60 or less.

The element of M1 may or may not be contained in the first n-type layer 4A. When the element of M1 is contained, the composition ratio thereof is preferably low. Thus, v4/(v1+v2+v3+v4) is preferably 0.00 or more and 0.05 or less. The element of M1 is preferably common to the elements contained in the second n-type layer 4B or the n-electrode 5.

In the first n-type layer 4A, Ga, Zn, Sn, and the element of M1 may an inclined change, a stepwise change, or a combination of the inclined change and the stepwise change from the p-type light-absorbing layer 3 side toward the n-electrode 5. For example, the amount of Sn is preferably large on the n-electrode 5 side, and the amount of Ga and Zn is preferably large on the second n-type layer 4B side.

The first n-type layer 4A is preferably formed by, for example, sputtering, atomic layer deposition (ALD), or the like.

The second n-type layer 4B is an n-type semiconductor layer. The second n-type layer 4B is disposed between the first n-type layer 4A and the p-type light-absorbing layer 3. The second n-type layer 4B is preferably in direct contact with a surface of the p-type light-absorbing layer 3 opposite to a surface in contact with the p-electrode 2. It is preferable that the second n-type layer 4B is an oxide semiconductor layer containing Ga and contains a compound having Ga as a base. In the second n-type layer 4B, an oxide having Ga as a base may be mixed with another oxide, an oxide having Ga as a base may be doped with another element, or an oxide having Ga as a base and doped with another element may be mixed with another oxide.

It is preferable that the second n-type layer 4B is a layer that mainly contains (50 wt % or more of) a compound represented by $Ga_{w1}M2_{w2}M3_{w3}M4_{w4}O_{w5}$, M2 is Al or/and B, M3 is one or more selected from the group consisting of In, Ti, Zn, Hf, and Zr, and M4 is one or more selected from the group consisting of Sn, Si, and Ge. w1 and w5 are numerical values of more than 0. w2, w3, and w4 are numerical values of 0.00 or more. When the sum of w1, w2, w3, and w4 is 2, w5 is preferably 3.00 or more and 3.80 or less. A mode in which an oxide having Ga as a base is mixed with another oxide, a mode in which an oxide having Ga as a base is doped with another element, and a mode in which an oxide having Ga as a base and doped with another element is mixed with another oxide are all represented by $Ga_{w1}M2_{w2}M3_{w3}M4_{w4}O_{w5}$.

90 wt % or more of the second n-type layer 4B is preferably a compound represented by $Ga_{w1}M2_{w2}M3_{w3}M4_{w4}O_{w5}$. 95 wt % or more of the second n-type layer 4B is more preferably a compound represented by $Ga_{w1}M2_{w2}M3_{w3}M4_{w4}O_{w5}$. 98 wt % or more of the second n-type layer 4B is still more preferably a compound represented by $Ga_{w1}M2_{w2}M3_{w3}M4_{w4}O_{w5}$. The second n-type layer 4B more preferably contains a compound represented by $Ga_{w1}M2_{w2}M3_{w3}M4_{w4}O_{w5}$ (100 wt % of $Ga_{w1}M2_{w2}M3_{w3}M4_{w4}O_{w5}$).

A composition of the compound of the second n-type layer 4B is an average composition of the entire second n-type layer 4B unless otherwise specified. When the thickness of the first n-type layer 4A is d, the composition of the second n-type layer 4B is an average value of compositions at depths of 0.2 d, 0.5 d, and 0.8 d from a surface of the second n-type layer 4B on the p-type light-absorbing layer 3 side. Unless there is a condition that an elemental composition ratio of the compound of the second n-type layer 4B is inclined, the second n-type layer 4B preferably satisfies the above compositions and the following suitable compositions at the depths. When the second n-type layer 4B is very thin (for example, 5 nm or less), the composition at a depth of 0.5 d from the surface of the second n-type layer 4B on the p-type light-absorbing layer 3 side can be regarded as the composition of the entire second n-type layer 4B. In the analysis, analysis spots distributed as evenly as possible at equal intervals as represented in analysis spots of FIG. 2 at each distance from the surface of the n-type layer 4 are analyzed by, for example, secondary ion mass spectrometry (SIMS). FIG. 2 is a schematic diagram of the solar cell 100 as viewed from the light incident side. D1 is a length of the second n-type layer 4B in the width direction, and D2 is a length of the second n-type layer 4B in the depth direction.

The second n-type layer 4B in which the difference between the conduction band minimum (CBM) of the p-type light-absorbing layer 3 and the conduction band minimum of the second n-type layer 4B is small is preferable. In order to reduce the difference in the conduction band minimum between the p-type light-absorbing layer 3 and the second n-type layer 4B, the element of M2 is contained in the compound of the second n-type layer 4B. The difference between the conduction band minimum of the p-type light-absorbing layer 3 and the conduction band minimum of the second n-type layer 4B on the p-type light-absorbing layer 3 side ([conduction band minimum of p-type light-absorbing layer 3]−[conduction band minimum of second n-type layer 4B]) is preferably 0.6 eV or more and 1.0 eV or less, and more preferably 0.6 eV or more and 0.8 eV or less.

The second n-type layer 4B in which the difference between the conduction band minimum of the second n-type layer 4B and the conduction band minimum of the first n-type layer 4A is small is preferable. In order to reduce the difference in the conduction band minimum between the first n-type layer 4A and the second n-type layer 4B, the element of M2 is contained in the compound of the second n-type layer 4B. The difference between the conduction band minimum of the second n-type layer 4B on the first n-type layer 4A side and the conduction band minimum of the first n-type layer 4A on the second n-type layer 4B side ([conduction band minimum of second n-type layer 4B]−[conduction band minimum of first n-type layer 4A]) is preferably 0.1 eV or more and 0.3 eV or less, and more preferably 0.2 eV or more and 0.3 eV or less. From the viewpoint of adjusting the conduction band minimum of the first n-type layer 4A, at least one of w2 and w3 is preferably a numerical value of more than 0.

In the second n-type layer 4B of the embodiment, the conduction band minimum is adjusted mainly by the elements of Ga and M2. An element ratio of M2 is increased, and thus, the conduction band minimum of the second n-type layer 4B increases. The difference in the conduction band minimum of the p-type light-absorbing layer 3 can be reduced. From the same viewpoint, in the second n-type layer 4B, (w1+w2)/(w1+w2+w3+w4) is preferably 0.80 or more and 1.00 or less, and more preferably 0.90 or more and 1.00 or less. As the element of M2, Al or Al and B are preferable, and Al is more preferable. Since conversion efficiency is improved by using an oxide having the elements of Ga and M2 as a base for the first n-type layer 4A, it is preferable that w2 is larger than w3 and w2 is larger than w4. From the same viewpoint, w2 is preferably larger than twice w3 and larger than twice w4.

w2/(w1+w2) is preferably 0.00 or more and 0.50 or less. When w2/(w1+w2) is larger than 0.50, a spike in which a conduction band at a p-n junction interface becomes discontinuous occurs, and FF decreases. Thus, it is difficult to obtain a solar cell having high conversion efficiency. From the above viewpoint, w2/(w1+w2) is more preferably 0.00 or more and 0.40 or less, and more preferably 0.00 or more and 0.20 or less.

In the second n-type layer 4B of the embodiment, the conduction band minimum can be adjusted by the elements of Ga and M3 (or M2 and M3). The compound of the second n-type layer 4B can contain one or more selected from the group consisting of In, Ti, Zn, Hg, and Zr represented by M3. $w3/(w1+w2+w3+w4)$ is preferably 0.00 or more and 0.80 or less. The element of M3 can adjust the conduction band minimum of the second n-type layer 4B. When the element of M3 is too large, the difference between the conduction band minimum of the first n-type layer 4A or the p-type light-absorbing layer 3 and the conduction band minimum of the second n-type layer 4B may increase. Thus, $w3/(w1+w2+w3+w4)$ is more preferably 0.00 or more and 0.10 or less, and more preferably 0.00 or more and 0.05 or less.

The compound of the second n-type layer 4B can contain one or more selected from the group consisting of Sn, Si, and Ge represented by M4. When the element of M4 is contained in the second n-type layer 4B, a carrier concentration of the second n-type layer 4B can be increased. $w4/(w1+w2+w3+w4)$ is preferably 0.00 or more and 0.15 or less, and more preferably 0.00 or more and 0.10 or less.

One or more selected from the group consisting of the elements of Ga and M2, the element of M3, and the element of M4 may have a composition ratio changing in the second n-type layer 4B in a film thickness direction of the second n-type layer 4B. It is preferable that the element of M4 is small on the p-type light-absorbing layer 3 side and is large on the first n-type layer 4A side. It is preferable that the element of M2 is large on the p-type light-absorbing layer 3 side and is small on the first n-type layer 4A side. It is preferable that the change in the composition is an inclined change, a stepwise change, or a combination of the inclined change and the stepwise change. The change in the composition is entirely or partially in a stacking direction of the layers of the solar cell 100. The carrier concentration, the conduction band minimum, and the refractive index can be adjusted from the p-type light-absorbing layer 3 side toward the n-electrode 5 side by changing a composition distribution of these elements, and thus, conversion efficiency can be improved.

It is preferable that the n-type layer 4 is formed by, for example, sputtering, atomic layer deposition (ALD), or the like.

The sum of a film thickness of the first n-type layer 4A and a film thickness of the second n-type layer 4B is typically 3 nm or more and 100 nm or less. When the sum of the film thickness of the first n-type layer 4A and the film thickness of the second n-type layer 4B is less than 3 nm, a leakage current is generated in a case where coverage of the first n-type layer 4A and the second n-type layer 4B is poor, and characteristics may be deteriorated. When the coverage is good, the film thickness is not limited to the above film thickness. When the sum of the film thickness of the first n-type layer 4A and the film thickness of the second n-type layer 4B exceeds 50 nm, characteristics may be deteriorated due to an excessive increase in resistance of the n-type layer 4 including the first n-type layer 4A and the second n-type layer 4B, or a short-circuit current may be reduced due to a decrease in transmittance. Accordingly, the sum of the film thickness of the first n-type layer 4A and the film thickness of the second n-type layer 4B is more preferably 3 nm or more and 30 nm or less, still more preferably 5 nm or more and 30 nm or less.

The n-type layer 4 may contain an element such as Cu diffused from the p-type light-absorbing layer 3. Cu is not contained in a raw material for forming the n-type pnlayer 4, and Cu contained in the p-type light-absorbing layer 3 is diffused into the n-type layer 4. When other elements are also used at the time of forming the p-type light-absorbing layer 3, these elements may also be diffused into the n-type layer 4.

The n-electrode 5 is an electrode on the first n-type layer 4A side having transparency to visible light. The first n-type layer 4A is sandwiched between the n-electrode 5 and the p-type light-absorbing layer 3. An intermediate layer (not illustrated) can be provided between the first n-type layer 4A and the n-electrode 5. The intermediate layer can include a mesh-shaped or line-shaped electrode. It is preferable that even when the intermediate layer is provided, the first n-type layer 4A and the n-electrode 5 are in direct contact with each other. It is preferable that a transparent conductive oxide film (semiconductor conductive film) or/and graphene is used for the n-electrode 5. It is preferable that the transparent conductive oxide film used for the n-electrode 5 is one or more kinds of transparent conductive films selected from the group consisting of an indium tin oxide, an aluminum-doped zinc oxide, a boron-doped zinc oxide, a gallium-doped zinc oxide, an indium-doped zinc oxide, a titanium-doped indium oxide, an indium gallium zinc oxide, and a hydrogen-doped indium oxide. A difference between a work function of graphene from the conduction band minimum of the first n-type layer 4A is also small. Even when the graphene is used for the n-electrode 5, an electron barrier can be reduced similarly to the transparent conductive oxide film. The graphene may be doped graphene. It is preferable that the graphene is used in combination with an intermediate layer such as an Ag wire from the viewpoint of conductivity and transparency. The transparent conductive oxide film and the graphene have a high work function, but the conduction band minimum of the first n-type layer 4A is also high. Accordingly, in the embodiment, the difference in the work function between the n-electrode 5 and the conduction band minimum of the n-type layer 4 in contact with the n-electrode 5 can be reduced.

A thickness of the n-electrode 5 is obtained by cross-sectional observation with an electron microscope or a step gauge, and is not particularly limited, but is typically 1 nm or more and 2 μm or less.

It is preferable that the n-electrode 5 is formed by, for example, sputtering.

Second Embodiment

Figure 3:
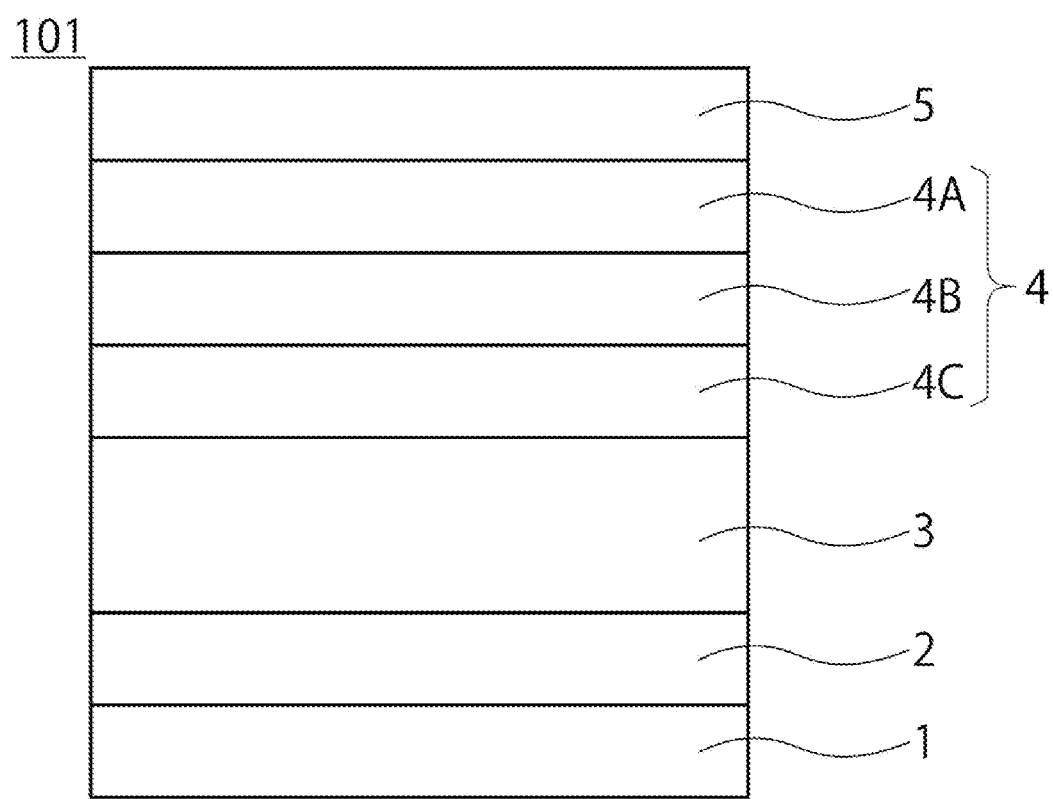
FIG. 3 is a cross-sectional view of a solar cell according to an embodiment.

A second embodiment relates to a solar cell. FIG. 3 illustrates a conceptual cross-sectional view of a solar cell 101 of the second embodiment. The solar cell 101 of the second embodiment is different from the solar cell 100 of the first embodiment in that the solar cell has an n-type layer 4 in which three layers of a first n-type layer 4A, a second n-type layer 4B, and a third n-type layer 4C are stacked. Description common to the first embodiment and the second embodiment will be omitted.

The third n-type layer 4C is located between the p-type light-absorbing layer 3 and the second n-type layer 4B. In FIG. 3, a surface of the third n-type layer 4C on the second n-type layer 4B side is in direct contact with the second n-type layer 4B. In FIG. 3, a surface of the third n-type layer 4C on the p-type light-absorbing layer 3 side is in direct contact with the p-type light-absorbing layer 3. It is preferable that the third n-type layer 4C is an oxide semiconductor layer containing Ga and contains a compound having Ga as a base. An interface between the second n-type layer 4B and the third n-type layer 4C may be clear or unclear. In the third n-type layer 4C, an oxide having Ga as a base may be mixed with another oxide, an oxide having Ga as a base may be doped with another element, or an oxide having Ga as a base and doped with another element may be mixed with another oxide.

It is preferable that the third n-type layer 4C is a layer that mainly contains (50 wt % or more of) a compound represented by $Ga_{x1}M2_{x2}M3_{x3}M4_{x4}O_{x5}$, M2 is Al or/and B, M3 is one or more selected from the group consisting of In, Ti, Zn, Hf, and Zr, and M4 is one or more selected from the group consisting of Sn, Si, and Ge. x1 and x5 are numerical values of more than 0. x2, x3, and x4 are numerical values of 0.00 or more. At least one of x2 and x3 is a numerical value of more than 0. When the sum of x1, x2, x3, and x4 is 2, x5 is preferably 3.00 or more and 3.80 or less. A mode in which an oxide having Ga as a base is mixed with another oxide, a mode in which an oxide having Ga as a base is doped with another element, and a mode in which an oxide having Ga as a base and doped with another element is mixed are all represented by $Ga_{x1}M2_{x2}M3_{x3}M4_{x4}O_{x5}$.

90 wt % or more of the third n-type layer 4C is preferably a compound represented by $Ga_{x1}M2_{x2}M3_{x3}M4_{x4}O_{x5}$. 95 wt % or more of the third n-type layer 4C is more preferably a compound represented by $Ga_{x1}M2_{x2}M3_{x3}M4_{x4}O_{x5}$. 98 wt % or more of the third n-type layer 4C is still more preferably a compound represented by $Ga_{x1}M2_{x2}M3_{x3}M4_{x4}O_{x5}$. The third n-type layer 4C more preferably contains a compound represented by $Ga_{x1}M2_{x2}M3_{x3}M4_{x4}O_{x5}$ (100 wt % of $Ga_{x1}M2_{x2}M3_{x3}M4_{x4}O_{x5}$).

In order to improve the continuity of the connection of the conduction band minimum with the layer in contact with the third n-type layer 4C, when the conduction band minimum of the second n-type layer 4B is adjusted, at least one of x2 and x3 is preferably a value of more than 0.

The conduction band minimum of the third n-type layer 4C is adjusted mainly by the elements of Ga and M2. The conduction band minimum of the third n-type layer 4C becomes higher than that of the second n-type layer 4B by increasing an element ratio of M2 of the third n-type layer 4C to be higher than that of the second n-type layer 4B and decreasing a ratio of Ga (x1 is smaller than w1 and x2 is larger than w2). The continuity of the connection of the conduction band minimum between the p-type light-absorbing layer 3 and the first n-type layer 4A is improved. In the third n-type layer 4C, $(x1+x2)/(x1+x2+x3+x4)$ is preferably 0.60 or more and 1.00 or less. From the same viewpoint, in the third n-type layer 4C, $(x1+x2)/(x1+x2+x3+x4)$ is preferably 0.80 or more and 1.00 or less, and more preferably 0.90 or more and 1.00 or less.

The third n-type layer 4C is a layer having a conduction band minimum higher than that of the second n-type layer 4B, and the conduction band minimum of the third n-type layer 4C is between the p-type light-absorbing layer 3 and the second n-type layer 4B. The third n-type layer 4C is used, and thus, the conduction band minimum is continuously connected from the p-type light-absorbing layer 3 to the first n-type layer 4A, and FF and Voc are improved. Conversion efficiency is improved. When x2 is a numerical value larger than 0, it is preferable that the third n-type layer 4C also has an element of M2 common to the second n-type layer 4B. That is, when Al is contained in the second n-type layer 4B, it is preferable that Al is contained rather than a case where Al is not contained in the third n-type layer 4C. Since x1 is smaller than w1 and x2 is larger than w2, the conduction band minimum of the third n-type layer 4C is higher than the conduction band minimum of the second n-type layer 4B, and the continuity of the connection of the conduction band minimum is improved. From the same viewpoint, $x2/(x1+x2)$ is preferably 0.10 or more and 0.30 or less, and more preferably 0.15 or more and 0.25 or less. When x2 and w2 are close values, the continuity of the connection of the conduction band minimum due to the provision of the third n-type layer 4C is less improved. Thus, w2 is preferably 10% or more and 90% or less of x2, w2 is more preferably 15% or more and 80% or less of x2, and w2 is more preferably 20% or more and 70% or less of x2.

When the third n-type layer 4C is included in the n-type layer 4, $(w1+w2)/(w1+w2+w3+w4)$ is preferably 0.90 or more and 1.00 or less in the second n-type layer 4B in consideration of the continuity of the conduction band minimum between the third n-type layer 4C and the second n-type layer 4B. $w2/(w1+w2)$ is preferably 0.00 or more and 0.20 or less. $w2/(w1+w2+w3+w4)$ is preferably 0.00 or more and 0.10 or less.

The difference between the conduction band minimum of the p-type light-absorbing layer 3 and the conduction band minimum of the third n-type layer 4C on the p-type light-absorbing layer 3 side ([conduction band minimum of p-type light-absorbing layer 3]−[conduction band minimum of third n-type layer 4C]) is preferably 0.3 eV or more and 0.9 eV or less, and more preferably 0.3 eV or more and 0.6 eV or less.

The difference between the conduction band minimum of the third n-type layer 4C and the conduction band minimum of the second n-type layer 4B on the third n-type layer 4C side ([conduction band minimum of third n-type layer 4C]−[conduction band minimum of second n-type layer 4B]) is preferably 0.1 eV or more and 0.3 eV or less, and more preferably 0.2 eV or more and 0.3 eV or less.

The difference between the conduction band minimum of the second n-type layer 4B and the conduction band minimum of the first n-type layer 4A on the second n-type layer 4B side ([conduction band minimum of second n-type layer 4B]−[conduction band minimum of first n-type layer 4A]) is preferably 0.1 eV or more and 0.3 eV or less, and more preferably 0.2 eV or more and 0.3 eV or less.

The n-type layer 4 has a three-layer structure, and thus, the difference in the conduction band minimum between the layers can be further reduced.

In the third n-type layer 4C of the embodiment, the conduction band minimum can be adjusted by elements of Ga and M3 (or M2 and M3). The compound of the third n-type layer 4C can contain one or more selected from the group consisting of In, Ti, Zn, Hg, and Zr represented by M3. $x3/(x1+x2+x3+x4)$ is preferably 0.00 or more and 0.50 or less, more preferably 0.00 or more and 0.10 or less, and still more preferably 0.00 or more and 0.05 or less. In consideration of continuity of connection of the conduction band minimum, w3 is preferably 0% or more and 90% or less of x3, more preferably 0% or more and 80% or less of x3, and still more preferably 0% or more and 70% or less of x3.

The element of M4 may be contained in the third n-type layer 4C. A carrier concentration of the second n-type layer 4B is preferably higher than that of the third n-type layer 4C (w4 is higher than x4). $x4/(x1+x2+x3+x4)$ is more preferably 0.01 or more and 0.15 or less, and still more preferably 0.05 or more and 0.15 or less. In consideration of the continuity of the connection of the conduction band minimum, x4 is preferably 0% or more and 90% or less of w4, more preferably 0% or more and 50% or less of w4, and still more preferably 0% or more and 10% or less of w4.

One or more selected from the group consisting of the elements of Ga and M2, the element of M3, and the element of M4 may have a composition ratio changing in the film thickness direction of the third n-type layer 4C in the third n-type layer 4C and in the film thickness direction of the second n-type layer 4B in the second n-type layer 4B. It is preferable that the elements of Ga and M4 are small on the p-type light-absorbing layer 3 side and are large on the first n-type layer 4A side. It is preferable that the element of M2 and the element of M3 are large on the p-type light-absorbing layer 3 side and are small on the first n-type layer 4A side. It is preferable that the change in the composition is an inclined change, a stepwise change, or a combination of the inclined change and the stepwise change. The change in the composition is entirely or partially in a stacking direction of the layers of the solar cell 101. The carrier concentration, the conduction band minimum, and the refractive index can be adjusted from the p-type light-absorbing layer 3 side toward the n-electrode 5 side by changing a composition distribution of these elements, and thus, conversion efficiency can be improved.

The sum of a film thickness of the first n-type layer 4A, a film thickness of the second n-type layer 4B, and a film thickness of the third n-type layer 4C is typically 3 nm or more and 100 nm or less. When the sum of the film thickness of the first n-type layer 4A, the film thickness of the second n-type layer 4B, and the film thickness of the third n-type layer 4C is less than 3 nm, a leakage current is generated in a case where coverage of the first n-type layer 4A, the second n-type layer 4B, and the third n-type layer 4C is poor, and characteristics may be deteriorated. When the coverage is good, the film thickness is not limited to the above film thickness. When the sum of the film thickness of the first n-type layer 4A, the film thickness of the second n-type layer 4B, and the film thickness of the third n-type layer 4C exceeds 50 nm, characteristics may be deteriorated due to an excessive increase in resistance of the n-type layer 4 from the first n-type layer 4A to the third n-type layer 4C, or a short-circuit current may be reduced due to a decrease in transmittance. Accordingly, the sum of the film thickness of the first n-type layer 4A, the film thickness of the second n-type layer 4B, and the film thickness of the third n-type layer 4C is more preferably 3 nm or more and 30 nm or less, still more preferably 5 nm or more and 30 nm or less.

Similarly to the solar cell 100 of the first embodiment, the solar cell 101 of the second embodiment also has excellent continuity of the connection at the conduction band minimum, and Jsc, Voc, and FF are improved. Conversion efficiency is improved.

Third Embodiment

Figure 4:
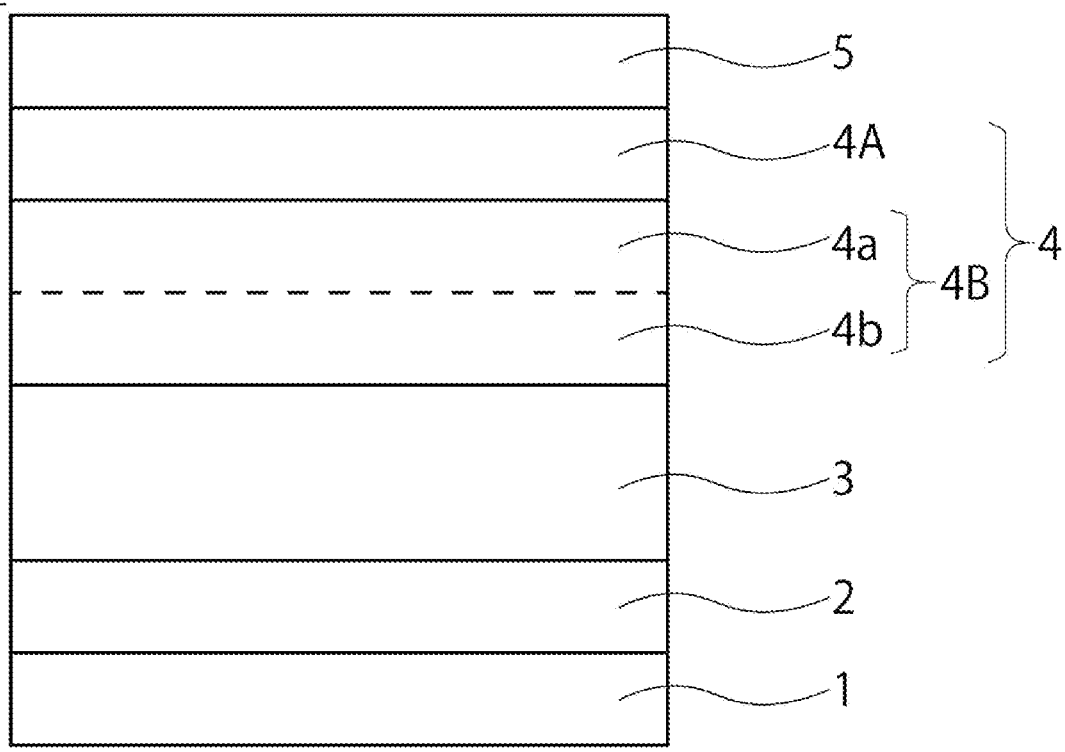
FIG. 4 is a cross-sectional view of a solar cell according to an embodiment.

A third embodiment relates to a solar cell. FIG. 4 is a schematic cross-sectional view of a solar cell 102 according to the third embodiment. The solar cell 102 of the third embodiment is different from the solar cell 101 of the second embodiment in that the second n-type layer 4B has a first region 4a and a second region 4b. Description common to the first embodiment, the second embodiment, and the third embodiment will be omitted.

The first region 4a is located on the first n-type layer 4A side of the second n-type layer 4B. The second region 4b is located on the p-type light-absorbing layer 3 side of the first n-type layer 4A. An interface between the first region 4a and the second region 4b is not confirmed. A region from a surface of the second n-type layer 4B on the p-type light-absorbing layer 3 side toward the first n-type layer 4A side up to half a thickness of the second n-type layer 4B is defined as the second region 4b. A region from a surface of the second n-type layer 4B on the first n-type layer 4A side toward the p-type light-absorbing layer 3 side up to half a thickness of the second n-type layer 4B is defined as the first region 4a. As in the first embodiment, in the analysis, analysis spots distributed as evenly as possible at equal intervals as represented in analysis spots of FIG. 2 at each distance from the surface of the n-type layer 4 are analyzed by, for example, SIMS.

The first region 4a of the third embodiment corresponds to the second n-type layer 4B of the second embodiment. The second region 4b of the third embodiment corresponds to the third n-type layer 4C of the second embodiment. Accordingly, an inclined composition change and the like described in the second embodiment are the same in the solar cell 102 and the like of the third embodiment.

Similarly to the solar cell 101 of the second embodiment, the solar cell 102 of the third embodiment also has excellent continuity of the connection at the conduction band minimum, and Jsc, Voc, and FF are improved. Conversion efficiency is improved.

Fourth Embodiment

Figure 5:
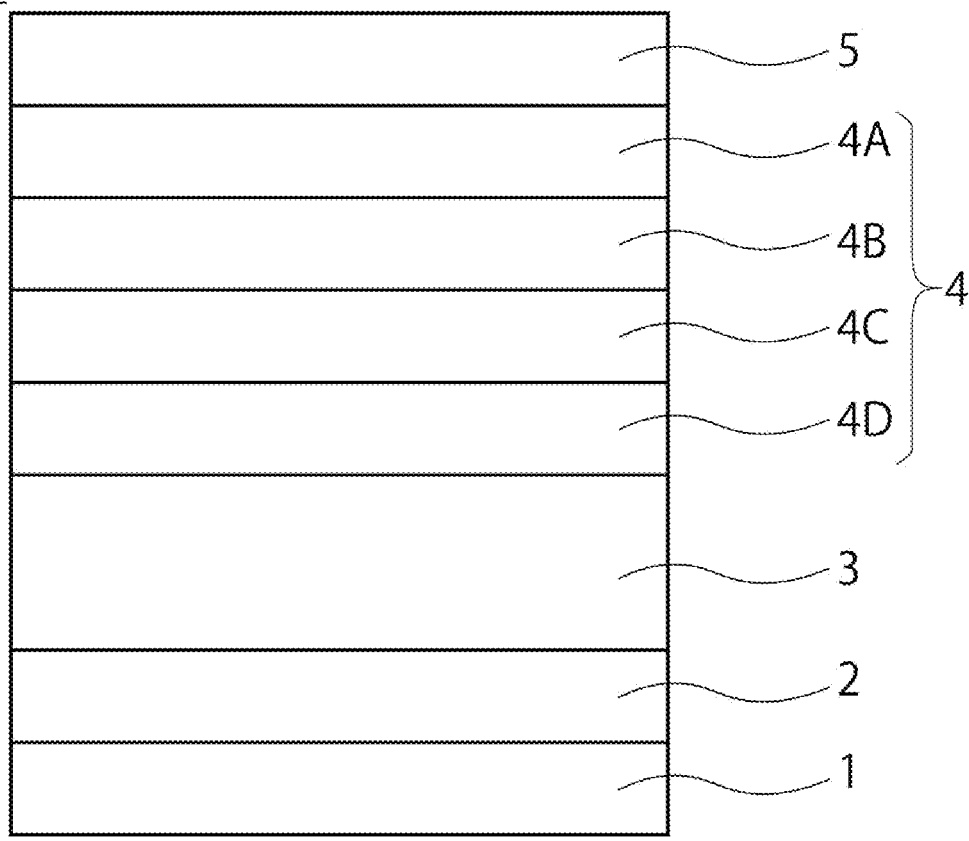
FIG. 5 is a cross-sectional view of a solar cell according to an embodiment.

A fourth embodiment relates to a solar cell. FIG. 5 is a schematic cross-sectional view of a solar cell 103 according to the fourth embodiment. The solar cell 103 of the fourth embodiment is different from the solar cell 101 of the second embodiment in that the solar cell has an n-type layers 4 in which four layers of a first n-type layer 4A, a second n-type layer 4B, a third n-type layer 4C, and a fourth n-type layer 4D are stacked. Description common to the first embodiment to the third embodiment and the fourth embodiment will be omitted.

The fourth n-type layer 4D is located between the p-type light-absorbing layer 3 and the third n-type layer 4C. In FIG. 5, a surface of the fourth n-type layer 4D on the third n-type layer 4C side is in direct contact with the third n-type layer 4C. In FIG. 5, a surface of the fourth n-type layer 4D on the p-type light-absorbing layer 3 side is in direct contact with the p-type light-absorbing layer 3. It is preferable that the fourth n-type layer 4D is an oxide semiconductor layer containing Ga and contains a compound having Ga as a base. An interface between the third n-type layer 4C and the fourth n-type layer 4D may be clear or unclear. In the fourth n-type layer 4D, an oxide having Ga as a base may be mixed with another oxide, an oxide having Ga as a base may be doped with another element, or an oxide having Ga as a base and doped with another element may be mixed with another oxide.

It is preferable that the fourth n-type layer 4D is a layer that mainly contains (50 wt % or more of) a compound represented by $Ga_{y1}M2_{y2}M3_{y3}M4_{y4}O_{y5}$, M2 is Al or/and B, M3 is one or more selected from the group consisting of In, Ti, Zn, Hf, and Zr, and M4 is preferably one or more selected from the group consisting of Sn, Si, and Ge. y1 and y5 are numerical values of more than 0. y2, y3, and y4 are numerical values of 0.00 or more. At least one of y2 and y3 is a numerical value of more than 0. When the sum of y1, y2, y3, and y4 is 2, y5 is preferably 3.0 or more and 3.8 or less. A mode in which an oxide having Ga as a base is mixed with another oxide, a mode in which an oxide having Ga as a base is doped with another element, and a mode in which an oxide having Ga as a base and doped with another element is mixed with another oxide are all represented by $Ga_{y1}M2_{y2}M3_{y3}M4_{y4}O_{y5}$.

90 wt % or more of the fourth n-type layer 4D is preferably a compound represented by $Ga_{y1}M2_{y2}M3_{y3}M4_{y4}O_{y5}$. 95 wt % or more of the fourth n-type layer 4D is more preferably a compound represented by $Ga_{y1}M2_{y2}M3_{y3}M4_{y4}O_{y5}$. 98 wt % or more of the fourth n-type layer 4D is still more preferably a compound represented by $Ga_{y1}M2_{y2}M3_{y3}M4_{y4}O_{y5}$. The fourth n-type layer 4D more preferably contains a compound represented by $Ga_{y1}M2_{y2}M3_{y3}M4_{y4}O_{y5}$ (100 wt % of $Ga_{y1}M2_{y2}M3_{y3}M4_{y4}O_{y5}$).

The conduction band minimum of the fourth n-type layer 4D is adjusted mainly by the elements of Ga and M2. The conduction band minimum of the fourth n-type layer 4D becomes higher than that of the third n-type layer 4C by increasing an element ratio M2 of the fourth n-type layer 4D to be higher than that of the third n-type layer 4C and decreasing a ratio of Ga (y1 is smaller than x1 and y2 is larger than x2). The continuity of the connection of the conduction band minimum between the p-type light-absorbing layer 3 and the first n-type layer 4A is improved. In the fourth n-type layer 4D, (y1+y2)/(y1+y2+y3+y4) is preferably 0.90 or more and 1.00 or less. The element ratio of M2 of the fourth n-type layer 4D is increased to be higher than that of the third n-type layer 4C and the ratio of Ga is decreased, and thus, the second n-type layer 2B is decreased to be smaller than that of the ratio of M2 of the third n-type layer 4C, that is, y1 is smaller than x1 and x1 is smaller than w1. Accordingly, the continuity of the connection of the conduction band minimum between the p-type light-absorbing layer 3 and the first n-type layer 4A can be further improved.

The fourth n-type layer 4D is a layer having a conduction band minimum higher than that of the third n-type layer 4C, and the conduction band minimum of the fourth n-type layer 4D is between the p-type light-absorbing layer 3 and the third n-type layer 4C. The fourth n-type layer 4D is used, and thus, the conduction band minimum is continuously connected from the p-type light-absorbing layer 3 to the first n-type layer 4A, and FF and Voc are improved. Conversion efficiency is improved. Thus, y2 may be larger than x2, and x2 may be larger than w2. When y2 is a numerical value larger than 0, it is preferable that the fourth n-type layer 4D also has an element of M2 common to the third n-type layer 4C. That is, when Al is contained in the third n-type layer 4C, it is preferable that Al is contained rather than a case where Al is not contained in the fourth n-type layer 4D. From the viewpoint of adjusting the conduction band minimum of the fourth n-type layer 4D, at least one of y2 and y3 is preferably a numerical value of more than 0.

As described above, the conduction band minimum of the fourth n-type layer 4D is higher than the conduction band minimum of the third n-type layer 4C and the conduction band minimum of the third n-type layer 4C is higher than the conduction band minimum of the second n-type layer 4B, and thus, the continuity of the connection of the conduction band minimum is improved. From the same viewpoint, y2/(y1+y2) is preferably 0.20 or more and 0.40 or less, and more preferably 0.25 or more and 0.35 or less. When y2 and x2 are close values, the continuity of the connection of the conduction band minimum due to the provision of the third n-type layer 4C is less improved. Thus, x2 is preferably 10% or more and 90% or less of y2 and w2 is preferably 0% or more and 50% or less of y2, x2 is more preferably 15% or more and 80% or less of y2 and w2 is more preferably 0% or more and 30% or less of y2, and x2 is still more preferably 20% or more and 70% or less of y2, and w2 is still more preferably 0% or more and 10% or less of y2.

In the fourth n-type layer 4D of the embodiment, the conduction band minimum can be adjusted by the elements of Ga and M3 (or M2 and M3). The compound of the fourth n-type layer 4D can contain one or more selected from the group consisting of In, Ti, Zn, Hg, and Zr represented by M3. x3/(x1+x2+x3+x4) is preferably 0.00 or more and 0.50 or less, more preferably 0.00 or more and 0.10 or less, and still more preferably 0.00 or more and 0.05 or less. In consideration of the continuity of the connection of the conduction band minimum, x3 is preferably 0% or more and 90% or less of y3 and w3 is preferably 0% or more and 50% or less of y3, x3 is more preferably 0% or more and 80% or less of y3 and w3 is more preferably 0% or more and 30% or less of y3, and x3 is still more preferably 0% or more and 70% or less of y3 and w3 is still more preferably 0% or more and 10% or less of y3.

The element of M4 may be contained in the fourth n-type layer 4D. A carrier concentration of the third n-type layer 4C is preferably higher than that of the fourth n-type layer 4D (x4 is higher than y4), and a carrier concentration of the second n-type layer 4B is preferably higher than that of the third n-type layer 4C (w4 is higher than x4). y4/(y1+y2+y3+y4) is more preferably 0.00 or more and 0.05 or less, and still more preferably 0.00 or more and 0.03 or less. In consideration of the continuity of the connection of the conduction band minimum, y4 is preferably 0% or more and 90% or less of x4 and 0% or more and 30% or less of w4, more preferably 0% or more and 50% or less of x4 and 0% or more and 10% or less of w4, and still more preferably 0% or more and 30% or less of x4 and 0% or more and 5% or less of w4.

The difference between the conduction band minimum of the p-type light-absorbing layer 3 and the conduction band minimum of the fourth n-type layer 4D on the p-type light-absorbing layer 3 side ([conduction band minimum of p-type light-absorbing layer 3]−[conduction band minimum of fourth n-type layer 4D]) is preferably 0.0 eV or more and 0.8 eV or less, and more preferably 0.0 eV or more and 0.4 eV or less.

The difference between the conduction band minimum of the fourth n-type layer 4D and the conduction band minimum of the third n-type layer 4C on the p-type light-absorbing layer 3 side ([conduction band minimum of fourth n-type layer 4D]−[conduction band minimum of third n-type layer 4C]) is preferably 0.1 eV or more and 0.3 eV or less, and more preferably 0.2 eV or more and 0.3 eV or less.

The difference between the conduction band minimum of the third n-type layer 4C and the conduction band minimum of the second n-type layer 4B on the third n-type layer 4C side ([conduction band minimum of third n-type layer 4C]−[conduction band minimum of second n-type layer 4B]) is preferably 0.1 eV or more and 0.3 eV or less, and more preferably 0.2 eV or more and 0.3 eV or less.

The difference between the conduction band minimum of the second n-type layer 4B and the conduction band minimum of the first n-type layer 4A on the second n-type layer 4B side ([conduction band minimum of second n-type layer 4B]−[conduction band minimum of first n-type layer 4A]) is preferably 0.1 eV or more and 0.3 eV or less, and more preferably 0.2 eV or more and 0.3 eV or less.

The n-type layer 4 has a four-layer structure, and thus, the difference in the conduction band minimum between the layers can be further reduced.

One or more selected from the group consisting of the elements of Ga and M2, the element of M3, and the element of M4 may have a composition ratio changing in the film thickness direction of the fourth n-type layer 4D in the fourth n-type layer 4D, in the film thickness direction of the third n-type layer 4C in the third n-type layer 4C, and in the film thickness direction of the second n-type layer 4B in the second n-type layer 4B. It is preferable that the elements of Ga and M4 are small on the p-type light-absorbing layer 3 side and are large on the first n-type layer 4A side. It is preferable that the element of M2 and the element of M3 are large on the p-type light-absorbing layer 3 side and are small on the first n-type layer 4A side. It is preferable that the change in the composition is an inclined change, a stepwise change, or a combination of the inclined change and the stepwise change. The change in the composition is entirely or partially in a stacking direction of the layers of the solar cell 101. The carrier concentration, the conduction band minimum, and the refractive index can be adjusted from the p-type light-absorbing layer 3 side toward the n-electrode 5 side by changing a composition distribution of these elements, and thus, conversion efficiency can be improved.

The sum of a film thickness of the first n-type layer 4A, a film thickness of the second n-type layer 4B, a film thickness of the third n-type layer 4C, and a film thickness of the fourth n-type layer 4D is typically 3 nm or more and 100 nm or less. When the sum of the film thickness of the first n-type layer 4A, the film thickness of the second n-type layer 4B, the film thickness of the third n-type layer 4C, and the film thickness of the fourth n-type layer 4D is less than 3 nm, a leakage current is generated in a case where coverage of the first n-type layer 4A, the second n-type layer 4B, the third n-type layer 4C, and the fourth n-type layer 4D is poor, and characteristics may be deteriorated. When the coverage is good, the film thickness is not limited to the above film thickness. When the sum of the film thickness of the first n-type layer 4A, the film thickness of the second n-type layer 4B, the film thickness of the third n-type layer 4C, and the film thickness of the fourth n-type layer 4D exceeds 50 nm, characteristics may be deteriorated due to an excessive increase in resistance of the n-type layer 4 from the first n-type layer 4A to the fourth n-type layer 4D, and a short-circuit current may be reduced due to a decrease in transmittance. Accordingly, the sum of the film thickness of the first n-type layer 4A, the film thickness of the second n-type layer 4B, the film thickness of the third n-type layer 4C, and the film thickness of fourth n-type layer 4D is more preferably 3 nm or more and 30 nm or less, still more preferably 5 nm or more and 30 nm or less.

Similarly to the solar cell 100 of the first embodiment, the solar cell 101 of the second embodiment also has excellent continuity of the connection at the conduction band minimum, and Jsc, Voc, and FF are improved. Conversion efficiency is improved.

Fifth Embodiment

Figure 6:
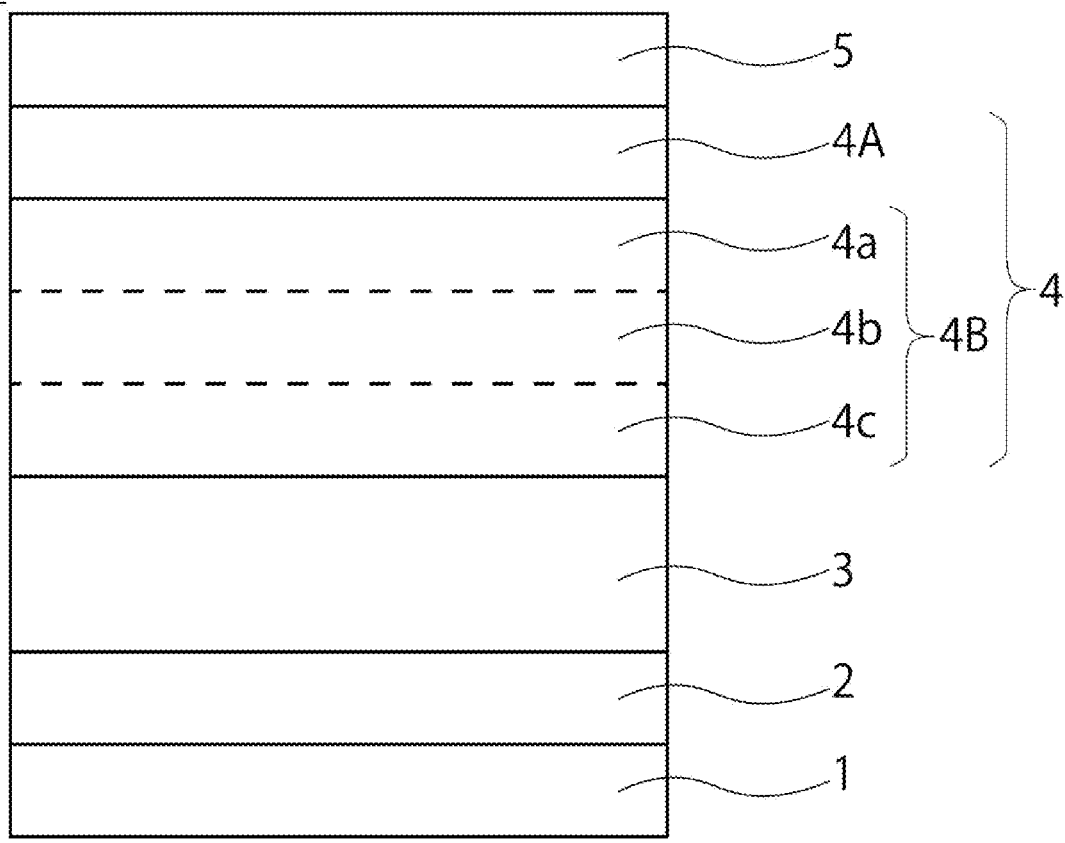
FIG. 6 is a cross-sectional view of a solar cell according to an embodiment.

A fifth embodiment relates to a solar cell. FIG. 6 is a schematic cross-sectional view of a solar cell 104 according to the fifth embodiment. The solar cell 103 of the fifth embodiment is different from the solar cell 100 of the first embodiment in that the second n-type layer 4B has a first region 4a, a second region 4b, and a third region 4c. Description common to the first embodiment to the fourth embodiment and the fifth embodiment will be omitted. The third region 4c of the fifth embodiment corresponds to the fourth n-type layer 4D of the third embodiment.

The first region 4a is located on the first n-type layer 4A side. The third region 4c is located on the p-type light-absorbing layer 3 side. The second region 4b is located between the first region 4a and the third region 4c. An interface between the first region 4a and the second region 4b and an interface between the second region 4b and the third region 4c are not confirmed. A region from a surface of the second n-type layer 4B on the p-type light-absorbing layer 3 side toward the first n-type layer 4A side up to ⅓ of a thickness of the second n-type layer 4B is defined as the third region 4c. A region from a surface of the second n-type layer 4B on the first n-type layer 4A side toward the p-type light-absorbing layer 3 side up to ⅓ of the thickness of the second n-type layer 4B is defined as the first region 4a. As in the first embodiment, in the analysis, analysis spots distributed as evenly as possible at equal intervals as represented in analysis spots of FIG. 2 at each distance from the surface of the n-type layer 4 are analyzed by, for example, SIMS.

The first region 4a of the fifth embodiment corresponds to the second n-type layer 4B of the fourth embodiment. The second region 4b of the fifth embodiment corresponds to the third n-type layer 4C of the fourth embodiment. The third region 4c of the fifth embodiment corresponds to the fourth n-type layer 4D of the fourth embodiment. The fourth region 4d of the fifth embodiment corresponds to the fourth n-type layer 4D of the fourth embodiment. Accordingly, the inclined composition change and the like described in the fourth embodiment are the same in the solar cell 104 and the like of the fifth embodiment.

Similarly to the solar cell 102 of the third embodiment, the solar cell 104 of the fifth embodiment also has excellent continuity of the connection at the conduction band minimum, and Jsc, Voc, and FF are improved. Conversion efficiency is improved.

Sixth Embodiment

Figure 7:
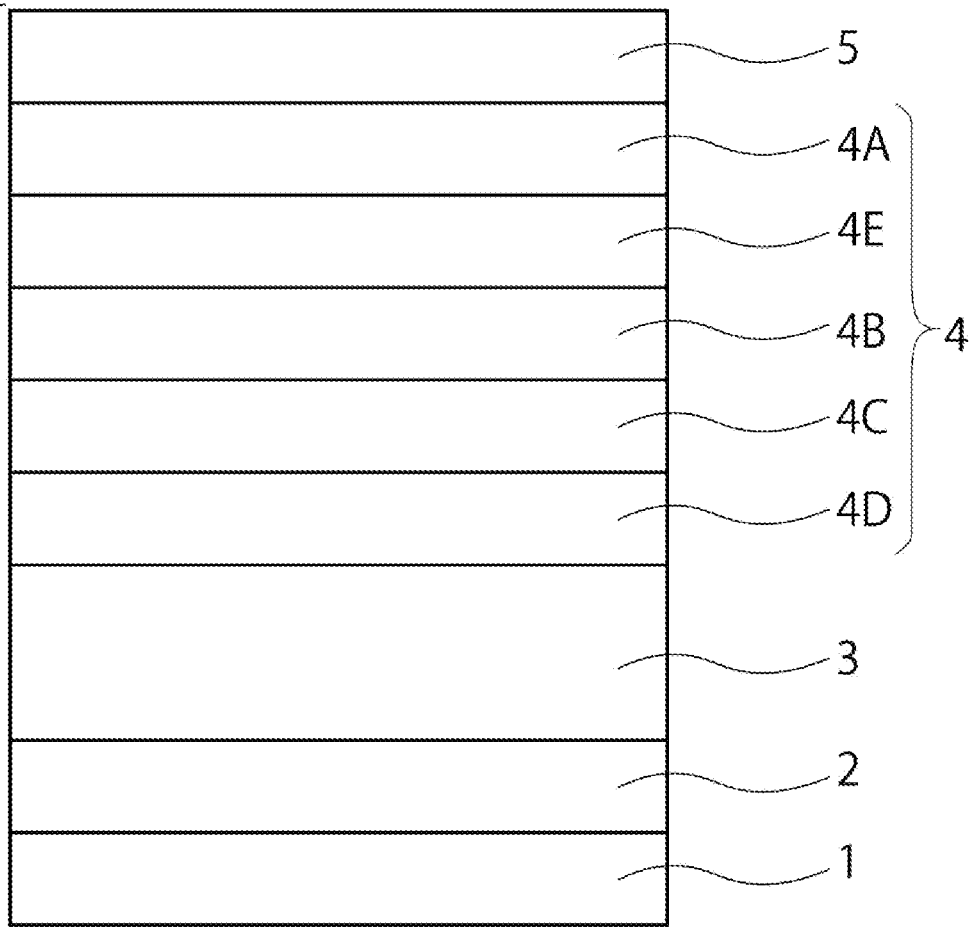
FIG. 7 is a cross-sectional view of a solar cell according to an embodiment.

A sixth embodiment relates to a solar cell. FIG. 7 is a schematic cross-sectional view of a solar cell 105 according to the sixth embodiment. The solar cell 105 of the sixth embodiment is different from the solar cell 103 of the fourth embodiment in that the solar cell has an n-type layers 4 in which five layers of a first n-type layer 4A, a fifth n-type layer 4E, a second n-type layer 4B, a third n-type layer 4C, and a fourth n-type layer 4D are stacked. Description common to the first embodiment to the fifth embodiment and the sixth embodiment will be omitted. The fifth n-type layer 4E can be used for any of the solar cells of the first embodiment to the fifth embodiment.

The fifth n-type layer 4E is located between the first n-type layer 4A and the second n-type layer 4B. In FIG. 7, a surface of the fifth n-type layer 4E on the first n-type layer 4A side is in direct contact with the first n-type layer 4A. In FIG. 7, a surface of the fifth n-type layer 4E on the second n-type layer 4B side is in direct contact with the second n-type layer 4B. It is preferable that the fourth n-type layer 4D is an oxide semiconductor layer containing Ga and contains a compound having Ga as a base. An interface between the third n-type layer 4C and the fourth n-type layer 4D may be clear or unclear. In the fourth n-type layer 4D, an oxide having Ga as a base may be mixed with another oxide, an oxide having Ga as a base may be doped with another element, or an oxide having Ga as a base and doped with another element may be mixed with another oxide.

It is preferable that the fifth n-type layer 4E is a layer that mainly contains (50 wt % or more of) a compound represented by $Ga_{z1}Zn_{z2}Sn_{z3}M1_{z4}O_{z5}$ and M1 is one or more selected from the group consisting of Hf, Zr, In, Ti, Al, B, Mg, Si, and Ge. z1, z2, and z4 are numerical values of 0.00 or more. z3 and z5 are numerical values of more than 0. At least one of z1 and z2 is a numerical value of more than 0. When the sum of z1, z2, z3, and z4 is 1, z5 is preferably 1.00 or more and 2.00 or less. All of a mode in which an oxide containing Ga or/and Zn as a base is mixed with another oxide, a mode in which an oxide containing Ga or/and Zn as a base is doped with another element, and a mode in which an oxide containing Ga or/and Zn as a base is doped with another element and an oxide containing Ga or/and Zn as a base is mixed with another oxide are represented by $Ga_{z1}Zn_{z2}Sn_{z3}M1_{z4}O_{z5}$.

90 wt % or more of the fifth n-type layer 4E is preferably a compound represented by $Ga_{z1}Zn_{z2}Sn_{z3}M1_{z4}O_{z5}$. 95 wt % or more of the fifth n-type layer 4E is more preferably a compound represented by $Ga_{z1}Zn_{z2}Sn_{z3}M1_{z4}O_{z5}$. 98 wt % or more of the fifth n-type layer 4E is still more preferably a compound represented by $Ga_{z1}Zn_{z2}Sn_{z3}M1_{z4}O_{z5}$. The fifth n-type layer 4E more preferably contains a compound represented by $Ga_{z1}Zn_{z2}Sn_{z3}M1_{z4}O_{z5}$ (100 wt % of $Ga_{z1}Zn_{z2}Sn_{z3}M1_{z4}O_{z5}$).

The fifth n-type layer 4E is adjusted mainly by Ga, Zn, and Sn so as to reduce a difference in conduction band minimum between the second n-type layer 4B and the first n-type layer 4A. Sn is increased or decreased to be more than the first n-type layer 4A, and thus, the work function and the conduction band minimum of the fifth n-type layer 4E are between the first n-type layer 4A and the second n-type layer 4B. z3 is preferably 50% or more and 80% or less of v3 or 120% or more and 150% or less of v3, and more preferably 50% or more and 70% of v3 or less or 130% or more and 150% or less of v3.

The fifth n-type layer 4E in which the difference between the conduction band minimum of the fifth n-type layer 4E and the conduction band minimum of the first n-type layer 4A is small is preferable. In order to reduce the difference in the conduction band minimum between the fifth n-type layer 4E and the first n-type layer 4A, elements Ga, Zn, and Sn are contained in the compound of the fifth n-type layer 4E. The difference between the conduction band minimum of the fifth n-type layer 4E and the conduction band minimum of the first n-type layer 4A ([conduction band minimum of fifth n-type layer 4E]−[conduction band minimum of first n-type layer 4A]) is preferably 0.1 eV or more and 0.3 eV or less, and more preferably 0.2 eV or more and 0.3 eV or less. Since the difference in the work function from the fifth n-type layer 4E to the n-electrode 5 is preferably small, the difference between the conduction band minimum of the first n-type layer 4A and the conduction band minimum of the n-electrode 5 ([conduction band minimum of first n-type layer 4A]−[work function of n-electrode 5]) is preferably 0.1 eV or more and 0.3 eV or less, and more preferably 0.2 eV or more and 0.3 eV or less.

Although suitable numerical ranges of z1, z2, z3, z4, and z5 of the fifth n-type layer 4E are similar to those of x1, x2, x3, x4, and x5 of the first n-type layer 4A, since a ratio of Sn (z3) in the fifth n-type layer 4E is higher or lower than a ratio of Sn (v3) in the first n-type layer 4A, the compound represented by $Ga_{z1}Zn_{z2}Sn_{z3}M1_{z4}O_{z5}$ in the first n-type layer 4A and the compound represented by $Ga_{z1}Zn_{z2}Sn_{z3}M1_{z4}O_{z5}$ in the fifth n-type layer 4E do not have the same composition.

The fifth n-type layer 4E is located on the p-type light-absorbing layer side of the first n-type layer 4A located closest to the n-electrode 5 side in the n-type layer, and preferably the fifth n-type layer 4E is in direct contact with the first n-type layer 4A and the second n-type layer 4B. When Zn or Sn is contained in the second n-type layer 4B or the like in the n-type layer 5, the composition ratio thereof is preferably lower than the concentrations of Zn and Sn in the fifth n-type layer 4E.

In the fifth n-type layer 4E, the elements of Ga, Zn, Sn, and M4 may an inclined change, a stepwise change, or a combination of the inclined change and the stepwise change from the p-type light-absorbing layer 3 side toward the n-electrode 5. For example, it is preferable that the amount of Sn is large on the first n-type layer 4A side and the amount of Ga and Zn is large on the second n-type layer 4B side or the amount of Sn is small on the first n-type layer 4A side and the amount of Ga and Zn is small on the second n-type layer 4B side.

The difference between the conduction band minimum of the p-type light-absorbing layer 3 and the conduction band minimum of the fourth n-type layer 4D on the p-type light-absorbing layer 3 side ([conduction band minimum of p-type light-absorbing layer 3]−[conduction band minimum of fourth n-type layer 4D]) is preferably 0.0 eV or more and 0.8 eV or less, and more preferably 0.0 eV or more and 0.4 eV or less.

The difference between the conduction band minimum of the fourth n-type layer 4D and the conduction band minimum of the third n-type layer 4C on the p-type light-absorbing layer 3 side ([conduction band minimum of fourth n-type layer 4D]−[conduction band minimum of third n-type layer 4C]) is preferably 0.1 eV or more and 0.3 eV or less, and more preferably 0.2 eV or more and 0.3 eV or less.

The difference between the conduction band minimum of the third n-type layer 4C and the conduction band minimum of the second n-type layer 4B on the third n-type layer 4C side ([conduction band minimum of third n-type layer 4C]−[conduction band minimum of second n-type layer 4B]) is preferably 0.1 eV or more and 0.3 eV or less, and more preferably 0.2 eV or more and 0.3 eV or less.

The difference between the conduction band minimum of the second n-type layer 4B and the conduction band minimum of the fifth n-type layer 4E on the second n-type layer 4B side ([conduction band minimum of second n-type layer 4B]−[conduction band minimum of fifth n-type layer 4E]) is preferably 0.1 eV or more and 0.3 eV or less, and more preferably 0.2 eV or more and 0.3 eV or less.

The difference between the conduction band minimum of the fifth n-type layer 4E and the conduction band minimum of the first n-type layer 4A on the fifth n-type layer 4E side ([conduction band minimum of fifth n-type layer 4E]−[conduction band minimum of first n-type layer 4A]) is preferably 0.1 eV or more and 0.3 eV or less, and more preferably 0.2 eV or more and 0.3 eV or less.

The n-type layer 4 has a five-layer structure, and thus, the difference in the conduction band minimum between the layers can be further reduced.

The sum of a film thickness of the first n-type layer 4A, a film thickness of the second n-type layer 4B, a film thickness of the third n-type layer 4C, a film thickness of the fourth n-type layer 4D, and a film thickness of the fifth n-type layer 4E is typically 3 nm or more and 100 nm or less. When the sum of the film thickness of the first n-type layer 4A, the film thickness of the second n-type layer 4B, the film thicknesses of the third n-type layer 4C and the fourth n-type layer 4D, and the film thickness of the fifth n-type layer 4E is less than 3 nm, a leakage current may be generated, and characteristics may be deteriorated in a case where coverage of the first n-type layer 4A, the second n-type layer 4B, the third n-type layer 4C, the fourth n-type layer 4D, and the fifth n-type layer 4E is poor. When the coverage is good, the film thickness is not limited to the above film thickness. When the film thickness of the first n-type layer 4A, the film thickness of the second n-type layer 4B, the film thickness of the third n-type layer 4C, the film thickness of the fourth n-type layer 4D, and the film thickness of the fifth n-type layer 4E exceed 50 nm, characteristics may be deteriorated due to an excessive increase in resistance of the n-type layer 4 from the first n-type layer 4A to the fifth n-type layer 4E, and a short-circuit current may be reduced due to a decrease in transmittance. Thus, the sum of the film thickness of the first n-type layer 4A, the film thickness of the second n-type layer 4B, the film thickness of the third n-type layer 4C, the film thickness of the fourth n-type layer 4D, and the film thickness of the fifth n-type layer 4E is more preferably 3 nm or more and 30 nm or less, still more preferably 5 nm or more and 30 nm or less.

Similarly to the solar cell 100 of the first embodiment, the solar cell 105 of the sixth embodiment also has a small difference in work function between the n-electrode 5 and the n-electrode 4 of the n-type layer 4, and Jsc, Voc, and FF are improved. Conversion efficiency is improved.

Seventh Embodiment

Figure 8:
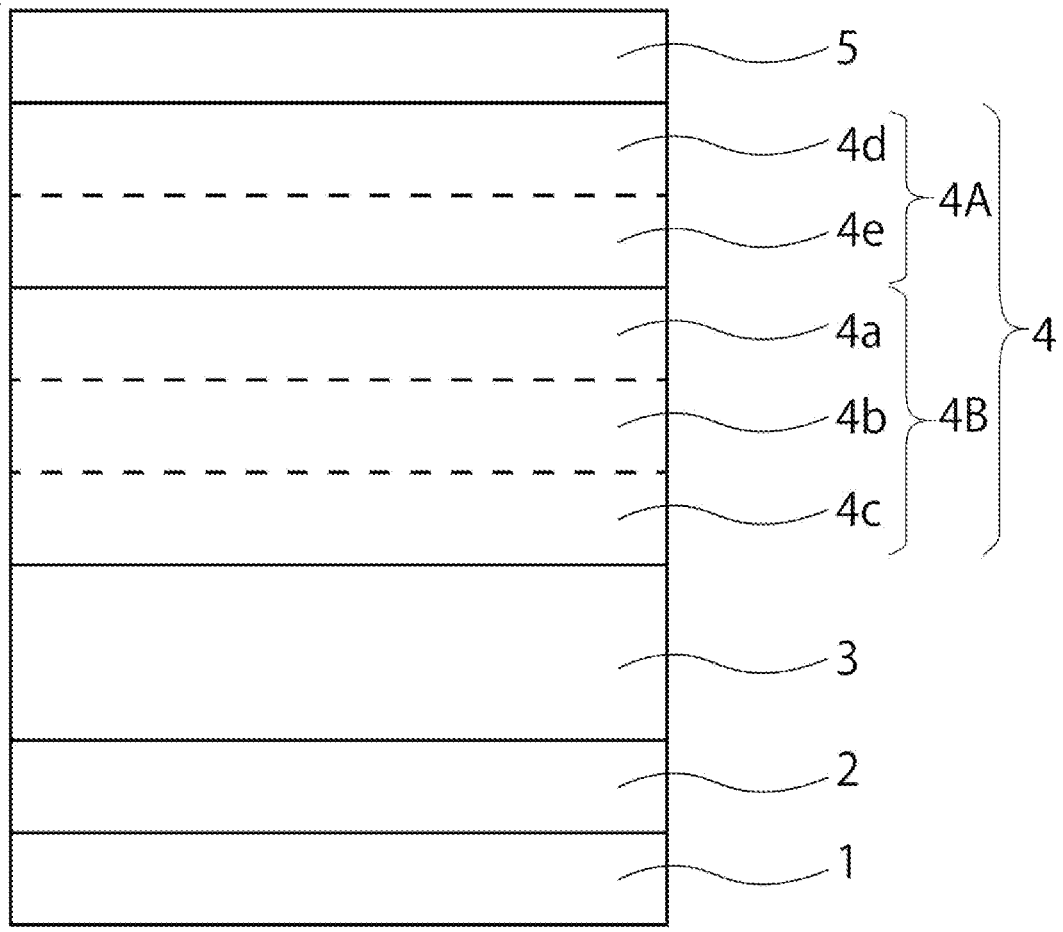
FIG. 8 is a cross-sectional view of a solar cell according to an embodiment.

A seventh embodiment relates to a solar cell. FIG. 8 is a schematic cross-sectional view of a solar cell 106 according to the seventh embodiment. The solar cell 106 of the seventh embodiment is different from the solar cell 104 of the fifth embodiment in that the first n-type layer 4A has a fourth region 4d and a fifth region 4e. Description common to the first embodiment to the sixth embodiment and the seventh embodiment will be omitted.

The fourth region 4d is located on the n-electrode 5 side of the first n-type layer 4A. The fifth region 4e is located on the p-type light-absorbing layer 3 side of the first n-type layer 4A. An interface between the fourth region 4d and the fifth region 4e is not confirmed. A region from a surface of the first n-type layer 4A on the p-type light-absorbing layer 3 side toward the n-electrode 5 side up to half a thickness of the first n-type layer 4A is defined as the fifth region 4e. A region from a surface of the first n-type layer 4A on the n-electrode 5 side toward the p-type light-absorbing layer 3 side up to half a thickness of the first n-type layer 4A is defined as the fourth region 4d. As in the first embodiment, in the analysis, analysis spots distributed as evenly as possible at equal intervals as represented in analysis spots of FIG. 2 at each distance from the surface of the n-type layer 4 are analyzed by, for example, SIMS.

The fourth region 4d of the seventh embodiment corresponds to the first n-type layer 4A of the sixth embodiment. The fifth region 4e of the seventh embodiment corresponds to the fifth n-type layer 4E of the sixth embodiment. Accordingly, the arrangement of the fifth n-type layer 4E, the inclined composition change, and the like described in the sixth embodiment are the same in the solar cell 106 and the like of the seventh embodiment. There may be no interface between the first n-type layer 4A and the second n-type layer 4B, and the n-type layer 4 may be one layer including the first region 4a to the fifth region 4e. In any of the embodiments, a part of the first n-type layer 4A to the fifth n-type layer 4E can be used as a region. For example, the fifth region 4e can be provided between the first n-type layer 4A and the second n-type layer 4B.

Similarly to the solar cell 105 of the sixth embodiment, the solar cell 106 of the seventh embodiment also has a small difference in work function between the n-electrode 5 and the n-electrode 4 of the n-type layer 4, and Jsc, Voc, and FF are improved. Conversion efficiency is improved.

Eighth Embodiment

Figure 9:
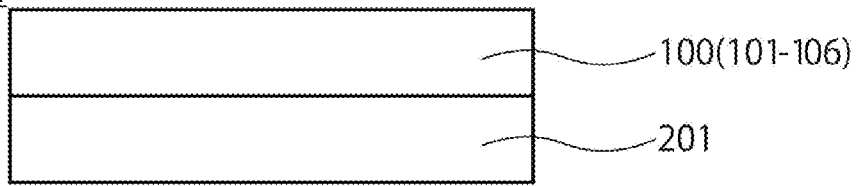
FIG. 9 is a cross-sectional view of a multi-junction solar cell according to an embodiment.

An eighth embodiment relates to a multi-junction solar cell. FIG. 9 illustrates a conceptual sectional diagram of a multi-junction solar cell 200 according to the eighth embodiment. The multi-junction solar cell 200 of FIG. 9 includes the solar cell (first solar cell) 100 of the first embodiment on the light incident side and a second solar cell 201. The band gap of the photoelectric conversion layer of the second solar cell 201 is smaller than the band gap of the light-absorbing layer 3 of the solar cell 100 according to the first embodiment. Incidentally, the multi-junction solar cell according to the embodiment includes a solar cell in which three or more solar cells are joined. Incidentally, in the eighth embodiment, the solar cell 101-106 of the second embodiment to the seventh embodiment can be used instead of the solar cell 100 of the first embodiment.

The band gap of the p-type light-absorbing layer 3 of the first solar cell 100 according to the first embodiment is about 2.0 eV-2.2 eV, and thus the band gap of the light-absorbing layer of the second solar cell 201 is preferably 1.0 eV or more and 1.6 eV or less. The light-absorbing layer of the second solar cell 201 is preferably selected from the group consisting of any one or more compound semiconductor layers among CIGS-based having a high In content CuZnSnSSe-based and CdTe-based compound semiconductor layers, crystalline silicon and perovskite type compound.

Ninth Embodiment

Figure 10:
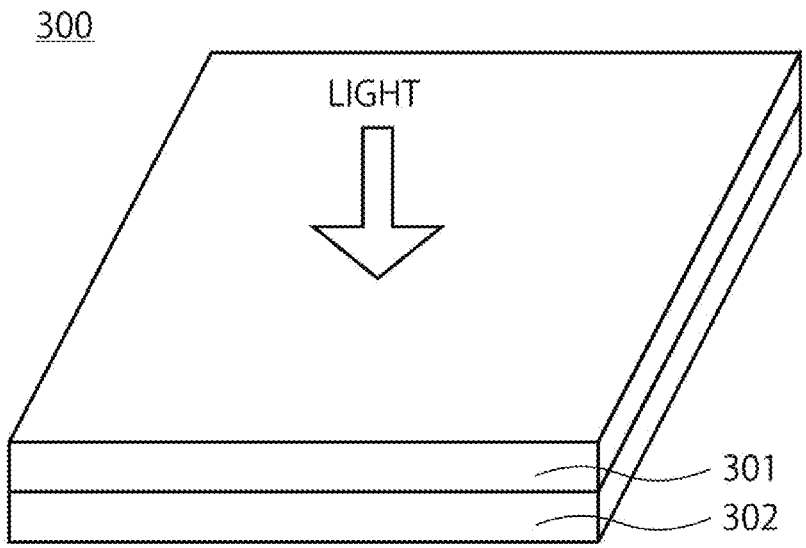
FIG. 10 is a perspective view of a solar cell module according to an embodiment.

A ninth embodiment relates to a solar cell module. FIG. 10 illustrates a perspective diagram of a solar cell module 300 according to the ninth embodiment. The solar cell module 300 in FIG. 5 is a solar cell module in which a first solar cell module 301 and a second solar cell module 302 are stacked one on the other. The first solar cell module 301 is on the light incident side and includes the solar cell 100 according to the first embodiment. It is preferable to use the second solar cell 201 in the second solar cell module 302. The solar cell 101-106 of the second embodiment to the seventh embodiment can be used for the first solar cell module 301.

Figure 11:
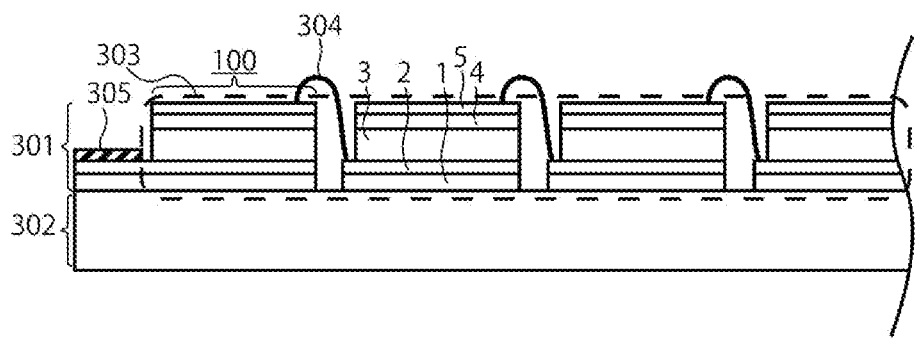
FIG. 11 is a cross-sectional view of a solar cell module according to an embodiment.

FIG. 11 illustrates a sectional diagram of the solar cell module 300. In FIG. 11, the structure of the first solar cell module 301 is illustrated in detail but the structure of the second solar cell module 302 is not illustrated. In the second solar cell module 302, the structure of the solar cell module is appropriately selected depending on the light-absorbing layer of the solar cell to be used. In the solar cell module 300 in FIG. 11, a plurality of submodules 303 in which a plurality of solar cells 100 are arranged in the horizontal direction and electrically connected to each other by a wiring 304 in series and which is enclosed by a broken line are included and the plurality of submodules 303 are electrically connected to each other in parallel or in series. Adjacent submodules are electrically connected by a busbar 305.

In adjacent solar cells 100, the n-electrode 5 on the upper side and the p-electrode 2 on the lower side are connected by the wiring 304. Similar to the solar cell 100 of the first embodiment, the solar cell 100 of the sixth embodiment includes the substrate 1, p-electrode 2, the p-type light-absorbing layer 3, the n-type layer 4, and the n-electrode 5. Both ends of the solar cell 100 in the submodule 303 are connected to the busbar 305. The busbar 305 is preferably configured to electrically connect a plurality of submodules 303 in parallel or in series and adjust the output voltage with the second solar cell module 302. Incidentally, the connection system of the solar cell 100 shown in the sixth embodiment is an example. The solar cell module can be configured by other connection systems.

Tenth Embodiment

Figure 12:
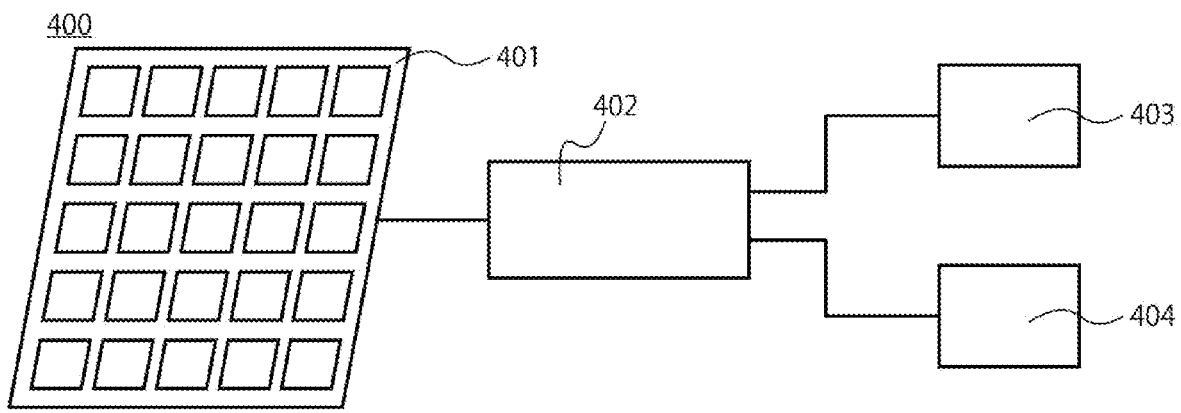
FIG. 12 is a structural view of a photovoltaic power generation system according to an embodiment.

A tenth embodiment relates to a solar photovoltaic power generation system. The solar cell module 300 according to the ninth embodiment can be used as a generator which generates electric power in the solar photovoltaic power generation system according to the tenth embodiment. The solar photovoltaic power generation system according to the embodiment generates electric power using a solar cell module and specifically includes a solar cell module which generates electric power, a unit which converts the generated electricity into electric power, and a power storage unit which stores the generated electricity or a load which consumes the generated electricity. FIG. 12 illustrates a configuration diagram of a solar photovoltaic power generation system 400 according to the embodiment. The solar photovoltaic power generation system in FIG. 12 includes a solar cell module 401 (300), a converter 402, a storage battery 403, and a load 404. Either of the storage battery 403 or the load 404 may be omitted. The load 404 may be configured to be able to utilize the electric energy stored in the storage battery 403. The converter 402 is an apparatus including a circuit or a device which performs power conversion such as voltage transformation or DC-AC conversion such as a DC-DC converter, DC-AC-converter, AC-AC-converter and the like. As the configuration of the converter 402, a suitable configuration may be adopted depending on the configuration of the generated voltage, the storage battery 403, and the load 404.

The solar cells included in the submodule 301 which has received light and is included in the solar cell module 300 generate electric power, and the electric energy is converted by the converter 402 and stored in the storage battery 403 or consumed by the load 404. It is preferable to provide the solar cell module 401 with a sunlight tracking and driving apparatus for constantly directing the solar cell module 401 toward the sun or a light collector which collects sunlight or to add an apparatus or the like for improving the power generation efficiency.

It is preferable that the solar photovoltaic power generation system 400 is used for immovable property such as dwellings, commercial facilities, and factories or for movable property such as vehicles, aircraft, and electronic devices. The electric power generation amount is expected to increase as the solar cell having an excellent conversion efficiency according to the embodiment is used in the solar cell module 401.

Figure 13:
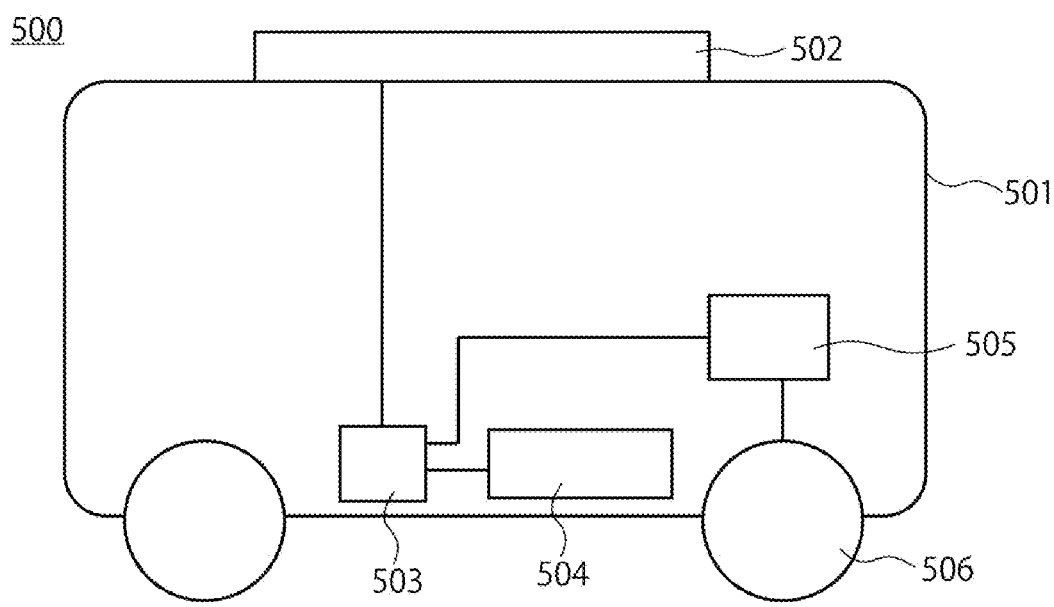
FIG. 13 is a conceptual diagram of a vehicle according to an embodiment.

A vehicle is described as an example of utilization of the solar photovoltaic power generation system 400. FIG. 13 illustrates a conceptual configuration diagram of a vehicle 500. The vehicle 500 in FIG. 13 includes a vehicle body 501, a solar cell module 502, a power converter 503, a storage battery 504, a motor 505, and tires (wheels) 506. The electric power generated by the solar cell module 502 provided on the upper portion of the vehicle body 501 is converted by the power converter 503 and is charged in the storage battery 504 or consumed by a load such as the motor 505. The vehicle 500 can be moved by rotating the tires (wheels) 506 by the motor 505 using the electric power supplied from the solar cell module 502 or the storage battery 504. The solar cell module 502 may not be a multi-junction type but may be configured only of such as the first solar cell module including the solar cell 100 according to the first embodiment. In the case of adopting a transparent solar cell module 502, it is also preferable to use the solar cell module 502 as a window for generating electric power on the side surface of the vehicle body 501 in addition to the upper portion of the vehicle body 501.

Figure 14:
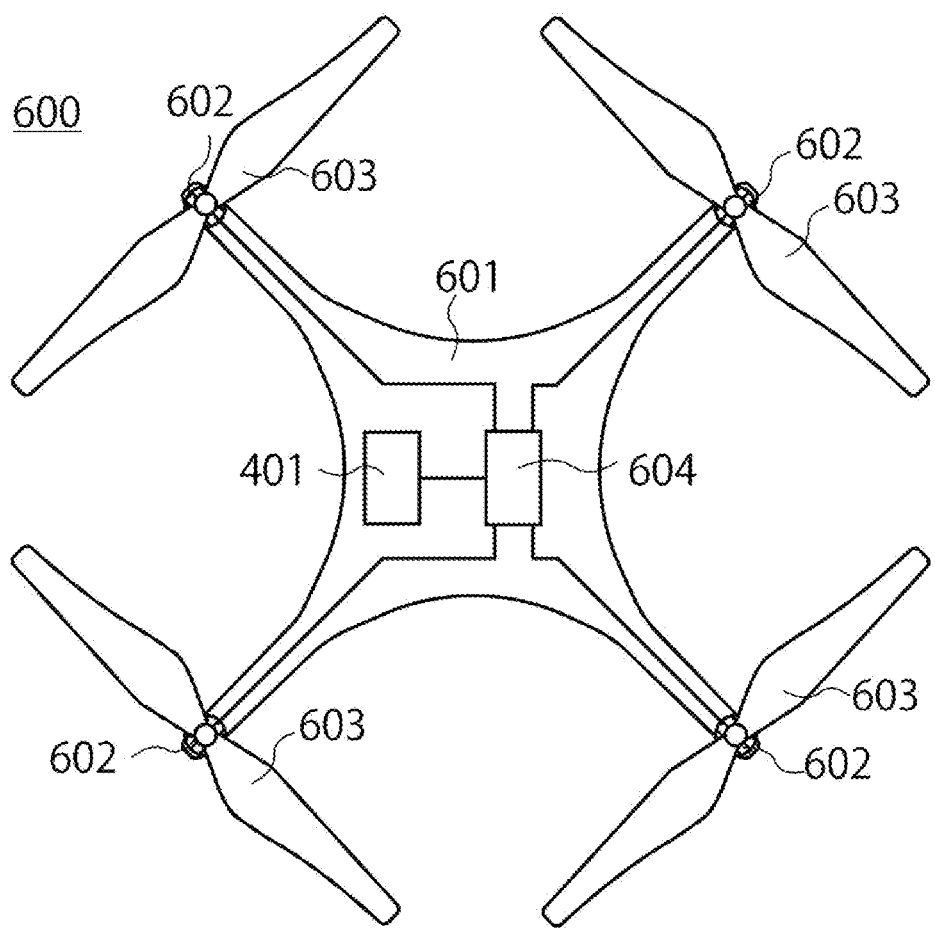
FIG. 14 is conceptual diagram of a flying object according to an embodiment.

A flying object (multi-copter) is described as an example of utilization of the solar photovoltaic power generation system 400. The flying object uses a solar cell module 401. The flying object according to the seventh embodiment uses the battery module 400 according to the fourth embodiment. A configuration of the flying object according to the present embodiment will be briefly described using a schematic view of a flying object 600 (quadcopter) of FIG. 14. The flying object 600 includes a solar cell module 401, an aircraft frame 601, motors 602, rotary wings 603, and a control unit 604. The solar cell module 401, the motors 602, the rotary wings 603, and the control unit 604 are disposed in the aircraft frame 601. The control unit 604 converts power output from the solar cell module 401 and adjusts output. The control unit 604 can further include a storage battery that stores the generated power by the solar cell module 401. The motors 602 rotate the rotary wings 603 using the power output from the solar cell module 401. By using the flying object 600 with the present configuration having the solar cell module 401 according to the embodiment, a flying object that can fly using more electric power is provided.

Hereinafter, the present disclosure will be described more specifically based on Examples, but the present disclosure is not limited to the following Examples.

EXAMPLE 1

ITO (In:Sn=90:10, film thickness 20 nm) and ATO (Sn:Sb=98:2, film thickness: 150 μm) are deposited on an upper surface of a glass substrate on a side in contact with glass as a p-electrode on a back surface side. A $Cu_2O$ light-absorbing layer is formed on a transparent p-electrode by heating at 500° C. by a sputtering method in an oxygen or argon gas atmosphere. Thereafter, by an ALD method, 10 nm of $Ga_{1.80}Al_{0.20}O_{3.00}$ having no composition inclination is deposited as a second n-type layer, and an AZO transparent conductive film is deposited as a first n-type layer by using 10 nm of $Zn_{0.81}Sn_{0.20}O_{1.20}$ having no composition inclination as the n-electrode on the deposited surface side. A solar cell is obtained by forming an $MgF_2$ film as an antireflection film. The obtained solar cell is evaluated for a short circuit current (Jsc), an open circuit voltage (Voc), a fill factor (FF), conversion efficiency, and transmittance. An oxygen composition ratio of the n-type layer is obtained from a type and a composition ratio of metal of a metal oxide.

The transmittance of the solar cell is evaluated. The transparency of the solar cell is an average transmittance when a wavelength of 700 to 1200 nm is measured with a spectrophotometer.

EXAMPLES 2 TO 27 AND COMPARATIVE EXAMPLES

Conditions of n-type layers and n-electrodes of Examples and Comparative Examples are illustrated in a table related to Examples of FIG. 15. The same procedures as in Example 1 were carried out except for the conditions of the n-type layers (first n-type layer, second n-type layer, and the like). When three n-type layers are formed in Examples, a thickness of each n-type layer is 6 nm. When four n-type layers are formed in Examples, a thickness of each n-type layer is 5 nm. When five n-type layers are formed in Examples, a thickness of each n-type layer is 4 nm. In Example 15, the first n-type layer includes a fourth region and a fifth region, and the second n-type layer includes a first region to a third region.

The amount of light is adjusted to 1 sun by using a solar simulator simulating a light source of AM 1.5G and using a reference Si cell under a light source. A temperature in a measurement chamber is 25° C. under an atmospheric pressure. A voltage is swept and a current density (current divided by a cell area) is measured. When a horizontal axis represents the voltage and a vertical axis represents the current density, a point intersecting the horizontal axis represents an open circuit voltage Voc, and a point intersecting the vertical axis represents a short circuit current density Jsc. When the voltage and the current density are multiplied on a measurement curve and maximum points are Vmpp and Jmpp (maximum power point), respectively, FF=(Vmpp*Jmpp)/(Voc*Jsc), and a conversion efficiency Eff. is obtained by Eff.=Voc*Jsc*FF.

In a table related to Examples of FIG. 16, the short circuit current (Jsc), the open circuit voltage (Voc), the fill factor (FF), the conversion efficiency, and the light transmittance of Examples and Comparative Examples are collectively illustrated.

The transmittance is evaluated as A when the transmittance of light in a wavelength band of 700 nm or more and 1200 nm or less is 75% or more, is evaluated as B when the transmittance of light in a wavelength band of 700 nm or more and 1200 nm or less is 70% or more and less than 75%, and is evaluated as C when the transmittance of light in a wavelength band of 700 nm or more and 1200 nm or less is less than 70%.

Jsc is evaluated as A when the conversion efficiency is 1.1 times or more the conversion efficiency of Comparative Example 1, is evaluated as B when the conversion efficiency is 1.0 times or more and less than 1.1 times Jsc of Comparative Example 1, and is evaluated as C when the conversion efficiency is less than 1.0 times Jsc of Comparative Example 1.

Voc is evaluated as A when Voc is 1.3 times or more the conversion efficiency of Comparative Example 1, is evaluated as B when Voc is 1.1 times or more and less than 1.3 times Voc of Comparative Example 1, and is evaluated as C when Voc is less than 1.1 times Voc of Comparative Example 21.

FF is evaluated as A when FF is 1.1 times or more the conversion efficiency of Comparative Example 1, is evaluated as B when FF is 1.0 times or more and less than 1.1 times FF of Comparative Example 1, and is evaluated as C when FF is less than 1.0 times FF of Comparative Example 1.

The conversion efficiency is evaluated as A when the conversion efficiency is 1.5 times or more the conversion efficiency of Comparative Example 1, is evaluated as B when the conversion efficiency is 1.1 times or more and less than 1.5 times the conversion efficiency of Comparative Example 1, and is evaluated as C when the conversion efficiency is less than 1.1 times the conversion efficiency of Comparative Example 1.

As can be seen from the table of FIG. 16, by applying a multilayer structure or an inclined structure in which the composition is intentionally controlled to the n-type layer in order to energetically smoothly connect the conduction band of the p-type light-absorbing layer and the n-electrode, each of Jsc, Voc, and FF is improved and the efficiency is greatly improved as compared with the comparative example. From the above results, it is understood that it is an important technique for controlling and optimizing an energy structure of the conduction band of the n-type layer in the film thickness direction in order to improve the characteristics of the $Cu_2O$ solar cell. In a multi-junction solar cell in which the solar cells of Examples are used as a top cell and a solar cell including Si as a light-absorbing layer is used as a bottom cell, excellent conversion efficiency can be obtained even in the multi-junction solar cell due to the high light transmittance and conversion efficiency of the top cell.

In the specification, some elements are represented only by chemical symbols for elements.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A solar cell comprising:
    a p-electrode;
    an n-electrode;
    a p-type light-absorbing layer located between the p-electrode and the n-electrode and mainly containing a cuprous oxide; and
    an n-type layer that includes
    a first n-type layer which is located between the p-type light-absorbing layer and the n-electrode, which mainly contains a compound represented by $Ga_{v1}Zn_{v2}Sn_{v3}M1_{v4}O_{v5}$, the M1 being one or more selected from the group consisting of Hf, Zr, In, Ti, Al, B, Mg, Si, and Ge, the v1, the v2, and the v4 being numerical values of 0.00 or more, the v3 and the v5 being numerical values of more than 0, at least one of the v1 and the v2 being a numerical value of more than 0, a sum of the v1, the v2, the v3, and the v4 being 1, and the v5 being 1.00 or more and 2.00 or less, and which is located on a side of the n-electrode, and
    a second n-type layer which is a layer that mainly contains a compound represented by $Ga_{w1}M2_{w2}M3_{w3}M4_{w4}O_{w5}$, the M2 being Al or/and B, the M3 is one or more selected from the group consisting of In, Ti, Zn, Hf, and Zr, the M4 being one or more selected from the group consisting of Sn, Si, and Ge, the w1 and the w5 being numerical values of more than 0, the w2, the w3, and the w4 being numerical values of 0.00 or more, a sum of the w1, the w2, the w3, and the w4 being 2, and w5 being 3.00 or more and 3.80 or less, and which is located on a side of the p-type light-absorbing layer.

2. The solar cell according to claim 1,
    wherein (v1+v2)/(v1+v2+v3+v4) is 0.30 or more and 0.90 or less,
    v3/(v1+v2+v3+v4) is 0.10 or more and 0.70 or less,
    v4/(v1+v2+v3+v4) is 0.00 or more and 0.05 or less,
    (w1+w2)/(w1+w2+w3+w4) is 0.80 or more and 1.00 or less,
    w2/(w1+w2) is 0.00 or more and 0.40 or less,
    w3/(w1+w2+w3+w4) is 0.00 or more and 0.80 or less, and
    w4/(w1+w2+w3+w4) is 0.00 or more and 0.15 or less.

3. The solar cell according to claim 1,
    wherein (v1+v2)/(v1+v2+v3+v4) is 0.40 or more and 0.90 or less,
    v3/(v1+v2+v3+v4) is 0.10 or more and 0.60 or less,
    v4/(v1+v2+v3+v4) is 0.00 or more and 0.05 or less,
    (w1+w2)/(w1+w2+w3+w4) is 0.90 or more and 1.00 or less,
    w2/(w1+w2) is 0.00 or more and 0.20 or less,
    w3/(w1+w2+w3+w4) is 0.00 or more and 0.10 or less,
    and w4/(w1+w2+w3+w4) is 0.00 or more and 0.10 or less.

4. The solar cell according to claim 1, wherein the first n-type layer is in direct contact with the n-electrode.

5. The solar cell according to claim 4,
wherein v2/(v1+v2+v3+v4) is 0.10 or less,
v1/(v1+v2+v3+v4) is 0.40 or more and 0.70 or less, and
v3/(v1+v2+v3+v4) is 0.30 or more and 0.60 or less.

6. The solar cell according to claim 1,
wherein v1/(v1+v2+v3+v4) is 0.10 or less,
v2/(v1+v2+v3+v4) is 0.70 or more and 0.90 or less, and
v3/(v1+v2+v3+v4) is 0.10 or more and 0.30 or less.

7. The solar cell according to claim 1,
wherein v1/(v1+v2+v3+v4) is 0.10 or less,
v2/(v1+v2+v3+v4) is 0.75 or more and 0.85 or less, and
v3/(v1+v2+v3+v4) is 0.15 or more and 0.25 or less.

8. The solar cell according to claim 1,
wherein v2/(v1+v2+v3+v4) is 0.10 or less,
v1/(v1+v2+v3+v4) is 0.30 or more and 0.80 or less, and
v3/(v1+v2+v3+v4) is 0.20 or more and 0.70 or less.

9. The solar cell according to claim 1,
wherein the n-type layer further includes a third n-type layer,
the third n-type layer is located between the p-type light-absorbing layer and the second n-type layer,
the third n-type layer mainly contains a compound represented by $Ga_{x1}M2_{x2}M3_{x3}M4_{x4}O_{x5}$,
the x1 and the x5 are numerical values of more than 0,
the x2, the x3, and the x4 are numerical values of 0.00 or more,
at least one of the x2 and the x3 is a numerical value of more than 0,
a sum of the x1, the x2, the x3, and the x4 is 2, and
x5 is 3.00 or more and 3.80 or less.

10. The solar cell according to claim 9,
wherein (x1+x2)/(x1+x2+x3+x4) is 0.60 or more and 1.00 or less,
the x1 is smaller than the w1,
the x2 is larger than the w2,
x2/(x1+x2) is 0.10 or more and 0.30 or less,
the w2 is 10% or more and 90% or less of the x2,
(w1+w2)/(w1+w2+w3+w4) is 0.90 or more and 1.00 or less,
w2/(w1+w2) is 0.00 or more and 0.20 or less,
x3/(x1+x2+x3+x4) is 0.00 or more and 0.50 or less,
the w3 is 0% or more and 90% or less of the x3,
x4/(x1+x2+x3+x4) is 0.01 or more and 0.15 or less, and
the x4 is 0% or more and 90% or less of the w4.

11. The solar cell according to claim 9,
wherein (x1+x2)/(x1+x2+x3+x4) is 0.80 or more and 1.00 or less,
x2/(x1+x2) is 0.10 or more and 0.30 or less,
the w2 is 15% or more and 80% or less of the x2,
w2/(w1+w2+w3+w4) is 0.00 or more and 0.20 or less,
x3/(x1+x2+x3+x4) is 0.00 or more and 0.10 or less,
the w3 is 0% or more and 80% or less of the x3,
x4/(x1+x2+x3+x4) is 0.05 or more and 0.15 or less, and
the x4 is 0% or more and 50% or less of the w4.

12. The solar cell according to claim 9,
wherein the n-type layer further includes a fourth n-type layer,
the fourth n-type layer is located between the third n-type layer and the p-type light-absorbing layer,
the fourth n-type layer mainly contains a compound represented by $Ga_{y1}M2_{y2}M3_{y3}M4_{y4}O_{y5}$,
the y1 and the y5 are numerical values of more than 0,
the y2, the y3, and the y4 are numerical values of 0.00 or more,
at least one of the y2 and the y3 is a numerical value of more than 0,
a sum of the y1, the y2, the y3, and the y4 is 2,
the y5 is 3.0 or more and 3.8 or less,
the y1 is smaller than the x1, and
the y2 is larger than the x2.

13. The solar cell according to claim 12,
wherein (y1+y2)/(y1+y2+y3+y4) is 0.90 or more and 1.00 or less,
y2/(y1+y2) is 0.20 or more and 0.40 or less,
the x2 is 10% or more and 90% or less of the y2,
the w2 is 0% or more and 50% or less of the y2,
x3/(x1+x2+x3+x4) is 0.00 or more and 0.50 or less,
the x3 is 0% or more and 90% or less of the y3,
the w3 is 0% or more and 50% or less of the y3,
y4/(y1+y2+y3+y4) is 0.00 or more and 0.05 or less,
the y4 is 0% or more and 90% or less of the x4, and
the y4 is 0% or more and 30% or less of the w4.

14. The solar cell according to claim 12,
wherein y2/(y1+y2) is 0.20 or more and 0.40 or less,
the x2 is 15% or more and 80% or less of the y2,
the w2 is 0% or more and 30% or less of the y2
x3/(x1+x2+x3+x4) is 0.00 or more and 0.05 or less,
the x3 is 0% or more and 80% or less of the y3,
the w3 is 0% or more and 30% or less of the y3,
y4/(y1+y2+y3+y4) is 0.00 or more and 0.03 or less,
the y4 is 0% or more and 50% or less of the x4, and
the y4 is 0% or more and 10% or less of the w4.

15. The solar cell according to claim 12,
wherein the n-type layer further includes a fifth n-type layer,
the fifth n-type layer is located between the first n-type layer and the second n-type layer,
the fifth n-type layer mainly contains a compound represented by $Ga_{z1}Zn_{z2}Sn_{z3}M1_{z4}O_{z5}$,
the z1, the z2, and the z4 are numerical values of 0.00 or more,
the z3 and the z5 are numerical values of more than 0,
at least one of the z1 and the z2 is a numerical value of more than 0,
a sum of the z1, the z2, the z3, and the z4 is 1, and
the z5 is 1.00 or more and 2.00 or less.

16. The solar cell according to claim 15,
wherein the z3 is 50% or more and 80% or less of the v3 or 120% or more and 150% or less of the v3.

17. A multi-junction solar cell comprising:
the solar cell according to claim 1; and
a solar cell including a light-absorbing layer in which a band gap is smaller than a band gap of the p-type light-absorbing layer of the solar cell according to claim 1.

18. A solar cell module using the solar cell according to claim 1.

19. A photovoltaic power generation system that performs photovoltaic power generation by using the solar cell module according to claim 18.

20. A solar cell comprising:
a p-electrode;
an n-electrode;
a p-type light-absorbing layer located between the p-electrode and the n-electrode and mainly containing a cuprous oxide; and
an n-type layer that includes
a first n-type layer which is located between the p-type light-absorbing layer and the n-electrode, is located on a side of the n-electrode, and has a first region and a fifth region, and a second n-type layer which is located on a side of the p-type light-absorbing layer, and has a second region, a third region, and a fourth region, wherein the first region mainly contains a compound represented by $Ga_{v1}Zn_{v2}Sn_{v3}M1_{v4}O_{v5}$, the M1 is one or more selected from the group consisting of Hf, Zr, In, Ti, Al, B, Mg, Si, and Ge, the v1, the v2, and the v4 are numerical values of 0.00 or more, the v3 and the v5 are numerical values of more than 0, at least one of the v1 and the v2 is a numerical value of more than 0, a sum of the v1, the v2, the v3, and the v4 being 1, the v5 being 1.00 or more and 2.00 or less, the second region is a layer that mainly contains a compound represented by $Ga_{w1}M2_{w2}M3_{w3}M4_{w4}O_{w5}$, the M2 is Al or/and B, the M3 is one or more selected from the group consisting of In, Ti, Zn, Hf, and Zr, the M4 is one or more selected from the group consisting of Sn, Si, and Ge, the w1 and the w5 are numerical values of more than 0, the w2, the w3, and the w4 are numerical values of 0.00 or more, at least one of the w2 and the w3 is a numerical value of more than 0, a sum of the w1, the w2, the w3, and the w4 is 2, and the w5 is 3.00 or more and 3.80 or less, the third region mainly contains a compound represented by $Ga_{x1}M2_{x2}M3_{x3}M4_{x4}O_{x5}$, the x1 and the x5 are numerical values of more than 0, the x2, the x3, and the x4 are numerical values of 0.00 or more, at least one of the x2 and the x3 is a numerical value of more than 0, a sum of the x1, the x2, the x3, and the x4 is 2, and the x5 is 3.00 or more and 3.80 or less, the fourth region mainly contains a compound represented by $Ga_{y1}M2_{y2}M3_{y3}M4_{y4}O_{y5}$, the y1 and the y5 are numerical values of more than 0, the y2, the y3, and the y4 are numerical values of 0.00 or more, at least one of the y2 and the y3 is a numerical value of more than 0, a sum of the y1, the y2, the y3, and the y4 is 2, the y5 is 3.0 or more 3.8 or less, the y1 is smaller than the x1, and the y2 is larger than the x2, and the fifth region mainly contains a compound represented by $Ga_{z1}Zn_{z2}Sn_{z3}M1_{z4}O_{z5}$, the z1, the z2, and the z4 are numerical values of 0.00 or more, the z3 and the z5 are numerical values of more than 0, at least one of the z1 and the z2 is a numerical value of more than 0, a sum of the z1, the z2, the z3, and the z4 is 1, and the z5 is 1.00 or more and 2.00 or less.

* * * * *